US007570678B2

(12) United States Patent
Tanaka

(10) Patent No.: US 7,570,678 B2
(45) Date of Patent: Aug. 4, 2009

(54) WAVELENGTH DETERMINING APPARATUS, WAVELENGTH DETERMINING METHOD, SEMICONDUCTOR LASER CONTROLLING APPARATUS, AND SEMICONDUCTOR LASER CONTROLLING METHOD

(75) Inventor: Tomiji Tanaka, Miyagi (JP)

(73) Assignee: Sony Corporation, Tokyo (JP)

( * ) Notice: Subject to any disclaimer, the term of this patent is extended or adjusted under 35 U.S.C. 154(b) by 593 days.

(21) Appl. No.: 11/110,056

(22) Filed: Apr. 20, 2005

(65) Prior Publication Data
US 2005/0249251 A1 Nov. 10, 2005

(30) Foreign Application Priority Data
Apr. 28, 2004 (JP) ............................. 2004-133055

(51) Int. Cl.
*H01S 3/13* (2006.01)
*G01B 9/02* (2006.01)
(52) U.S. Cl. ...................... 372/29.01; 372/32; 356/450
(58) Field of Classification Search ............. 372/29.02, 372/32; 356/450
See application file for complete search history.

(56) References Cited

U.S. PATENT DOCUMENTS

| 5,493,575 | A | * | 2/1996 | Kitamura ..................... 372/20 |
| 6,016,323 | A | * | 1/2000 | Kafka et al. .................. 372/20 |
| 6,870,629 | B1 | * | 3/2005 | Vogel et al. ................. 356/519 |
| 2002/0136104 | A1 | * | 9/2002 | Daiber .................... 369/44.23 |

* cited by examiner

*Primary Examiner*—Armando Rodriguez
*Assistant Examiner*—Phillip Nguyen
(74) *Attorney, Agent, or Firm*—Robert J. Depke; Rockey, Depke & Lyons, LLC

(57) ABSTRACT

A wavelength determining apparatus is disclosed. The wavelength determining apparatus includes a reflection block, a light detection block, and a determination block. The reflection block receives at least part of a laser light beam emitted from an external cavity type semiconductor laser and emits a reflected light beam that has a distribution of light intensities of fringes. The light detection block detects the intensity of the light beam reflected from the reflection block in two or more light reception positions. The determination block obtains a difference value of detection signals in the two or more light reception positions and determines the wavelength of the laser light beam on the basis of the difference value. The two or more light reception positions are arranged in the direction of which the fringes take place.

14 Claims, 14 Drawing Sheets

200 LASER SYSTEM

60 HOLOGRAM RECORDING AND REPRODUCING SYSTEM

WAVELENGTH DETERMINING APPARATUS, WAVELENGTH DETERMINING METHOD, SEMICONDUCTOR LASER CONTROLLING APPARATUS, AND SEMICONDUCTOR LASER CONTROLLING METHOD

CROSS REFERENCES TO RELATED APPLICATIONS

The present invention contains subject matter related to Japanese Patent Application JP 2004-133055 filed in the Japanese Patent Office on Apr. 28, 2004 and Japanese Patent Application JP 2005-115414 filed in the Japanese Patent Office on Apr. 13, 2005, the entire contents of which being incorporated herein by reference.

BACKGROUND OF THE INVENTION

1. Field of the Invention

The present invention relates to a laser system that has an external cavity type semiconductor laser, in particular, a wavelength determining apparatus, a wavelength determining method, a semiconductor laser controlling apparatus, and a semiconductor laser controlling method that allow an oscillation mode of an external cavity type semiconductor laser to be stable.

2. Description of the Related Art

In recent years, since laser systems have features of small size, low power consumption, and so forth, they have been widely used for information devices. For example, a single mode laser has been used for a homographic data storage (HDS). In the HDS, one laser light beam is sprit into two laser light beams by a beam splitter. Thereafter, the split laser light beams interfere with each other on a recording medium so that data are recorded.

As light sources for which holograms are recorded and reproduced, a gas laser and a second harmonic generation (SHG) laser that are single mode light sources are often used. When a semiconductor laser such as a laser diode (LD) that oscillates in a multi-mode is combined with an external cavity, the semiconductor laser can be used in a single mode. As a result, the semiconductor laser can be used for a light source with which holograms are recorded and reproduced.

Next, with reference to FIG. 1, the structure of a typical Littrow type laser system including an external cavity type semiconductor laser of the related art will be described. FIG. 1 is a plan view showing a laser system 200. The structure of the laser system 200 is the same as the structure of a laser system described in Non-Patent Document 1.

[Non-Patent Document]

L. Ricci, et al.: "A compact grating-stabilized diode laser system for atomic physics," Optics Communication, 117 1995, pp 541-549.

In the laser system 200, a laser light beam of multi-longitudinal mode (oscillation light beam) emitted from a semiconductor laser device such as a laser diode 201 is collimated by a lens 202 and then entered into a grating 203. The grating 203 outputs a first-order diffracted light beam. A first-order diffracted light beam having a predetermined wavelength that depends on the alignment angle of the grating 203 is reversely injected to the laser diode 201. As a result, the laser diode 201 resonates with the injected first-order diffracted light beam and emits a single mode light beam (zero-th order light beam denoted by arrow F in FIG. 1). The wavelength of the zero-th order light beam is the same as the wavelength of the light beam returned from the grating 203.

In the example, with a combination of a screw 205 and a piezoelectric device, the angle of the grating 203 is precisely adjusted.

Next, with reference to a graph shown in FIG. 2, the relationship between the laser power of a laser light beam that is output from the external cavity type laser system described in FIG. 1 and the wavelength of the laser light beam will be described. The horizontal axis of the graph shown in FIG. 2 represents the laser power in mW, whereas the vertical axis of the graph represents the wavelength in nm. FIG. 2 shows that as the laser power of laser light beam increases, the wavelength of the laser light beam vary nearly in a saw shape.

The external cavity type laser system has a mode hop region of an external cavity and a mode hop region of a semiconductor laser chip. In the mode hop region of the external cavity, as the laser power increases, the wavelength of the laser light beam that is emitted gradually increases. In the mode hop region of the semiconductor laser chip, as the laser power increases, the wavelength of the laser light beam that is emitted sharply decreases. As the laser power increases, the wavelength of the laser light beam discretely varies to some extent.

When the laser power is around 30 mW, a laser light beam having a single wavelength is emitted as a perfect single mode. However, when the laser power is around 32 mW, a laser light beam that has three modes are generated. When the laser power is around 35 mW, namely in the mode hop region of the semiconductor laser, the laser light beam has three modes around wavelength of 409.75 nm and three modes around wavelength of 409.715 nm, a total of six modes.

FIG. 3A, FIG. 3B, FIG. 3C, and FIG. 3D show spectrums of several laser light beams. As described above, in the mode hop region of the external cavity, the wavelength of the laser light beam gradually increases and the laser light beams have spectrums as shown in FIG. 3A, FIG. 3B, and FIG. 3C. However, in the mode hop region of the laser chip of the semiconductor laser, the laser power is around 35 mW and a laser light beam has a spectrum as shown in FIG. 3D.

When these laser light beams are used for the HDS, a laser light beam having three modes with a laser power of around 32 mW (as shown in FIG. 3A) and a laser light beam having two modes (as shown in FIG. 3B) have the same recording and reproducing characteristics as a laser light beam having a single mode (with a spectrum shown in FIG. 3C). Thus, these laser light beams can be used in the same manner as a laser light beam having a single mode. In this example, the perfect signal mode that takes place in a laser light beam having a laser power of around 30 mW and the three modes and two modes that take place in laser light beams having a laser power of around 32 mW are referred to as the usable mode as a general term.

On the other hand, as shown in FIG. 3D, a laser light beam having six modes that takes place with a laser power of around 35 mW is similar to two sets of three modes, the two sets being apart from each other by around 40 pm. Thus, when data are recorded on a hologram medium with a laser light beam having a usable mode, the M/# of the hologram medium is 6.5. If data are recorded on this hologram medium with a laser light beam having an unusable mode, the M/# of the hologram medium deteriorates and decreases to 2.5.

The M/# is named the M number that is one of important factors used to evaluate the characteristics of the medium. In other words, when hologram data are recorded, a light beam emitted from the same laser light source is divided into two light beams by the beam splitter. Two light beams of a record light beam and a reference light beam are reflected by the mirror and emitted to the same position of the medium. When hologram data are reproduced, only the reference light beam is emitted to the same position of the medium in the same manner as the hologram data are recorded and a diffracted light beam is obtained. With the incident light amount and the diffracted light amount of the reference light emitted to reproduce the hologram data, the diffraction efficiency is defined as follows.

Diffraction efficiency=diffracted light amount/incident light amount

The M/# is defined as follows.

M/#=Σ(root of diffraction efficiency)

where Σ is the sum of diffraction efficiencies in the case that hologram data are multiplex-recorded at the same position. The root would be necessary from an optical view point. As is clear from the foregoing formula, when the number of multiplexing times is large, the sum becomes large. Thus, the M/# increases. In addition, when hologram data are strongly recorded, the diffraction efficiency becomes large. Thus, the M/# increases. In other words, as the M/# becomes larger, the medium can be more suitably used to multiplex-record hologram data.

The region in which a laser light beam having a usable mode is obtained nearly matches the mode hop region of the external cavity. The region in which a laser light beam having an unusable mode is obtained nearly matches the mode hop region of the laser chip of the semiconductor laser. As is clear from the graph shown in FIG. 2, since the region in which a laser light beam having a usable mode is obtained is much wider than the region in which a laser light beam having an unusable mode is obtained. Thus, if a laser light beam having an unusable mode can be effectively eliminated, the external cavity type semiconductor laser can be used for the HDS.

In addition, the relationship between the laser power and the wavelength of a laser light beams vary with the internal temperature of the external cavity type laser. When the temperature of the external cavity type semiconductor laser is not constant, the position of the laser power with which the laser light beam has an unusable mode varies. Thus, in the related art, the temperature of the external cavity type semiconductor laser is kept almost constant (within a deviation of 10 mK) and the region of a laser light beam having an unusable mode is prevented from varying. In addition, the laser power in the region is not used.

SUMMARY OF THE INVENTION

However, in the method of the related art, to cause the external cavity type semiconductor laser not to emit a laser light beam having an unusable mode, it is necessary to control the laser power while the internal temperature of the external cavity type semiconductor laser is kept almost constant. Thus, the structure and control of the laser system become complicated.

Although the laser power of the external cavity type semiconductor laser may be controlled with the detected result of the wavelength, the size of the wavelength detection device of the related art is very large and it is expensive. Thus, this method would not be applicable to the HDS and so forth.

In view of the foregoing, it would be desirable to provide a wavelength determining apparatus and a wavelength determining method that are capable of determining the wavelength of a laser light beam emitted from an external cavity type semiconductor laser that is simply structured.

In view of the foregoing, it would be also desirable to provide a semiconductor laser controlling apparatus and a semiconductor laser controlling method that are capable of suppressing emission of a laser light beam having an unusable mode on the basis of a determined result of the wavelength.

According to an embodiment of the present invention, there is provided a wavelength determining apparatus. The wavelength determining apparatus includes a reflection block, a light detection block, and a determination block. The reflection block receives at least part of a laser light beam emitted from an external cavity type semiconductor laser and emits a reflected light beam that has a distribution of light intensities of fringes. The light detection block detects the intensity of the light beam reflected from the reflection block in two or more light reception positions. The determination block obtains a difference value of detection signals in the two or more light reception positions and determines the wavelength of the laser light beam on the basis of the difference value. The two or more light reception positions are arranged in the direction of which the fringes take place.

According to an embodiment of the present invention, there is provided a wavelength determining method. The wavelength determining method includes a receiving step, detecting step, and an obtaining step. At the receiving step, at least part of a laser light beam emitted from an external cavity type semiconductor laser is received and a reflected light beam that has a distribution of light intensities of fringes is emitted. At the detecting step, the light intensity of the light beam reflected at the reflection step are detected in two or more light reception positions. At the obtaining step, a difference value of detection signals in the two or more light reception positions is obtained and the wavelength of the laser light beam is determined on the basis of the difference value. The two or more light reception positions are arranged in the direction of which the fringes take place.

According to an embodiment of the present invention, there is provided a semiconductor laser controlling apparatus. The semiconductor laser controlling apparatus includes a reflection block, a light detection block, and a control block. The reflection block receives at least part of a laser light beam emitted from an external cavity type semiconductor laser and emits a reflected light beam that has a distribution of light intensities of fringes. The light detection block detects the intensity of the light beam reflected from the reflection block in two or more light reception positions. The control block obtains a difference value of detection signals in the two or more light reception positions and increases or decreases a current value supplied to the external cavity type semiconductor laser when the difference value becomes a predetermined value. The two or more light reception positions are arranged in the direction of which the fringes take place.

According to an embodiment of the present invention, there is provided a semiconductor laser controlling method. The semiconductor laser controlling method includes a receiving step, a detecting step, and an obtaining step. At the receiving step, at least part of a laser light beam emitted from an external cavity type semiconductor laser is received and a reflected light beam that has a distribution of light intensities of fringes is emitted. At the detecting step, the intensity of the light beam reflected at the reflection step is detected in two or more light reception positions. At the obtaining step, a difference value of detection signals is obtained in the two or more light reception positions. A current value supplied to the external cavity type semiconductor laser is increased or decreased when the difference value becomes a predetermined value. The two or more light reception positions are arranged in the direction of which the fringes take place.

The wavelength determining apparatus, the wavelength determining method, the semiconductor laser controlling apparatus, and the semiconductor laser controlling method according to embodiments of the present invention are capable of determining the wavelength of a laser light beam emitted from an external cavity type semiconductor laser although these apparatus and methods are simply structured. In addition, the laser power of a semiconductor laser can be controlled on the basis of the determined result so that a laser light beam having an unusable mode is prevented from being emitted.

These and other objects, features and advantages of the present invention will become more apparent in light of the following detailed description of a best mode embodiment thereof, as illustrated in the accompanying drawings.

BRIEF DESCRIPTION OF THE DRAWINGS

The invention will become more fully understood from the following detailed description, taken in conjunction with the accompanying drawing, wherein similar reference numerals denote similar elements, in which.

DETAILED DESCRIPTION OF THE PREFERRED EMBODIMENTS

According to an embodiment of the present invention, the wavelength of a laser light beam emitted from an external cavity type semiconductor laser is detected with an optical wedge and the power of the external cavity type semiconductor laser is controlled on the basis of the detected result so that a laser light beam having an unusable mode is prevented from being emitted.

First, an optical wedge that is an example of an optical device that generates interference fringes will be described. The optical wedge is a glass plate having an angle of around a fragment of one degree formed by the front and rear sides. When a laser light beam is incident to the optical wedge with an angle of around 45 degrees, a light beam reflected on the front surface of the glass plate and a light beam reflected on the rear surface of the glass plate interfere with each other and form interference fringes.

Figure 4:
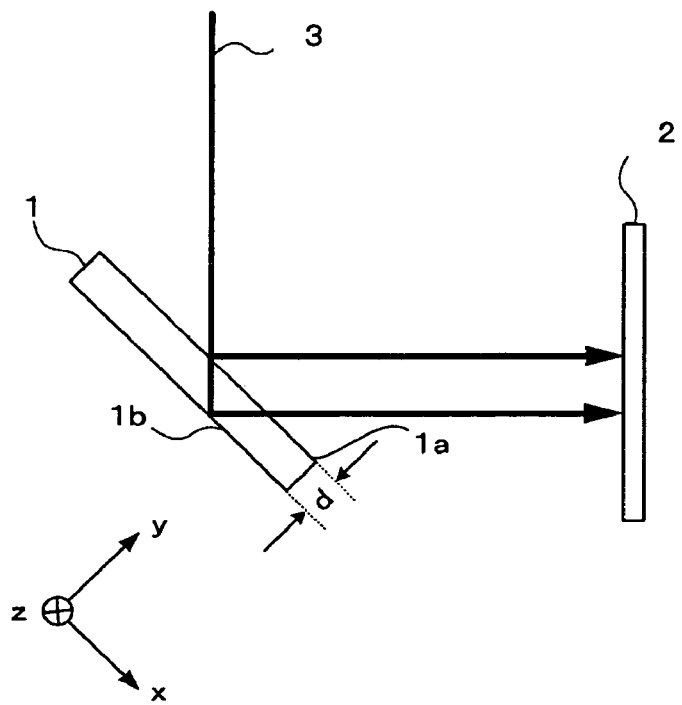
FIG. 4 is a schematic diagram describing an optical wedge.

FIG. 4 is a schematic diagram showing how a laser light beam enters an optical wedge 1. The laser light beam 3 is reflected by the optical wedge 1. Thereafter, the laser light beam 3 enters an obscure glass plate 2. The optical wedge 1 is tapered in the z axis direction so that the thickness d of the optical wedge 1 gradually decreases. The z axis direction is a direction viewed from the front surface of the drawing shown in FIG. 4 to the rear surface thereof. The x axis direction is in parallel with a front surface 1$a$ and a rear surface 1$b$ of the optical wedge 1 and perpendicular to the y axis. The y axis direction is perpendicular to the x axis and the z axis.

Figure 5:
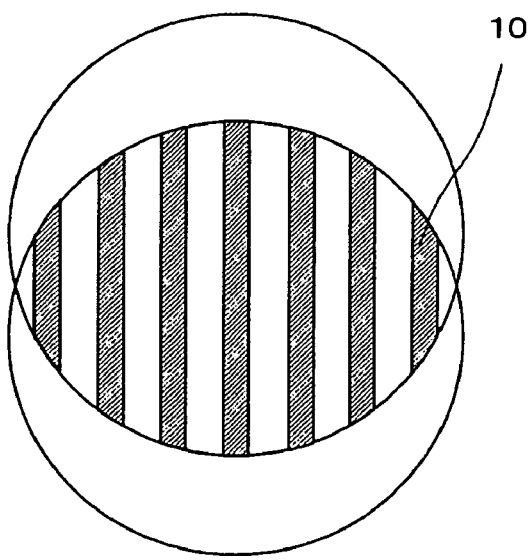
FIG. 5 is a schematic diagram showing interference fringes that take place with a laser light beam reflected by the optical wedge.

FIG. 5 is a schematic diagram showing an example of interference fringes observed on the obscure glass plate 2 in the arrangement shown in FIG. 4. The laser light beam 3 is reflected on the front surface 1$a$ of the optical wedge 1. Thereafter, the laser beam 3 enters the obscure glass plate 2. In addition, the laser light beam 3 is reflected on the rear surface 1$b$ of the optical wedge 1. Thereafter, the laser beam 3 enters the obscure glass plate 2. Thus, an optical path difference takes place between the laser beam 3 that is reflected by the front surface 1$a$ and the laser beam 3 that is reflected by the rear surface 1$b$. As a result, interference fringes 10 shown in FIG. 5 take place. FIG. 5 shows that the interference fringes 10 take place in a direction nearly perpendicular to the z axis. However, the interference fringes 10 may take place in a direction perpendicular to the z axis with an angle due to an influence of an aberration of an optical system that may be used.

As will be described later, according to an embodiment of the present invention, the user does not need to directly see the interference fringes 10 shown in FIG. 5 with his or her eyes. Thus, the obscure glass plate 2 is not an essential element of an embodiment of the present invention. According to an embodiment of the present invention, to detect the interference fringes 10, at least two detectors are used.

Figure 6:
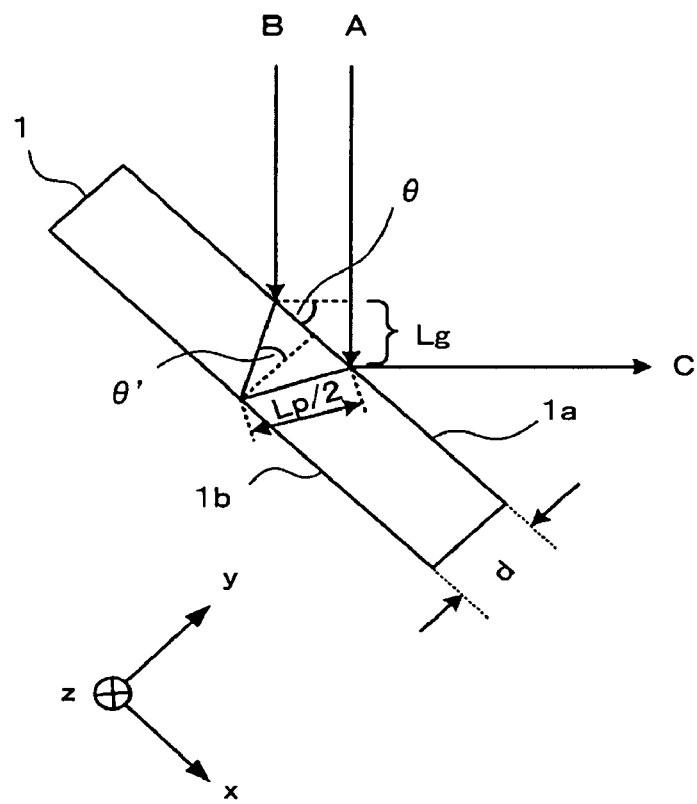
FIG. 6 is a schematic diagram describing how an optical path difference of the optical wedge is calculated.

Next, the optical wedge will be described in more detail. Now, it is considered that light beams A and B of one laser enter an optical wedge 1 as shown in FIG. 6. It is assumed that the optical wedge 1 shown in FIG. 6 is the same as the optical wedge 1 shown in FIG. 4. The optical wedge 1 is tapered in the z axis direction so that the thickness d of the optical wedge 1 gradually decreases.

In addition, it is assumed that the light beam A is reflected on a front surface 1a of the optical wedge 1 and becomes a light beam C and the light beam B is reflected on a rear surface 1b of the optical wedge 1 and becomes the light beam C. At this point, the optical path difference between the optical path of the light beam A and the optical path of the light beam B is obtained. With the obtained optical path difference, the phase difference of the light beam C is calculated. The Snell's law satisfies the following formula 1.

$$\sin\theta/\sin\theta' = n \quad \text{(formula 1)}$$

On the other hand, the length Lg is given by the following formula 2.

$$Lg = 2d^*\tan\theta'^*\sin\theta \quad \text{(formula 2)}$$

On the other hand, the distance Lp for which the light beam B passes through the optical wedge 1 is given by the following formula 3.

$$Lp = 2(Lp/2) = 2(d/\cos\theta') = 2d/\cos\theta' \quad \text{(formula 3)}$$

When Lp' is assumed as the optical distance of Lp, Lp' is given by the following formula 4.

$$Lp' = 2nd/\cos\theta' \quad \text{(formula 4)}$$

The optical path difference ΔL between Lp' and Lg is given by the following formula 5.

$$\Delta L = Lp' - Lg = 2nd/\cos\theta' - 2d^*\tan\theta'^*\sin\theta = 2d(n/\cos\theta' - \sin\theta^*\tan\theta') \quad \text{(formula 5)}$$

The phase difference Δδ with respect to ΔL is given by the following formula.

$$\Delta\delta = \Delta L/\lambda + \pi \quad \text{(formula 6)}$$

where π is added to represent the phase change due to reflection of a light beam. The light intensity I is given by the following formula 7.

$$I = (\cos\Delta\delta)^2 \quad \text{(formula 7)}$$

Figure 7:
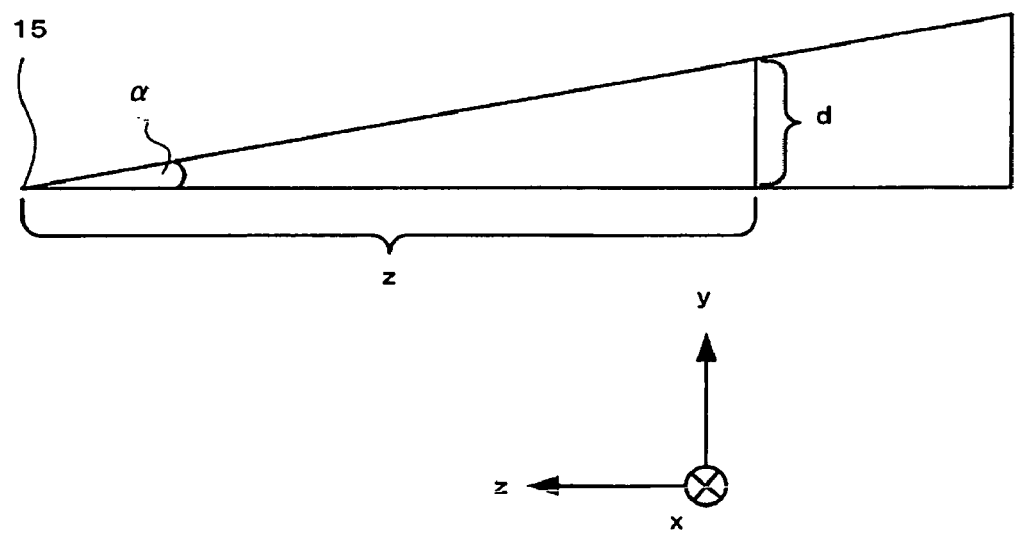
FIG. 7 is a schematic diagram showing the optical wedge viewed along the x axis direction.

The optical wedge 1 shown in FIG. 6 is literally wedge-shaped when viewed along the x axis. The optical wedge 1 has a tip portion 15 formed with an angle of α (this angle is sometimes referred to as the wedge angle). This relationship of the optical wedge 1 is shown in FIG. 7. However, the optical wedge 1 does not need to have the tip portion 15. Normally, the optical wedge 1 is trapezoidal-shaped and does not have a tapered tip portion. In addition, as shown in FIG. 7, the thickness d of the optical wedge 1 is expressed by a function of the displacement z of the z axis coordinate. The thickness d of the optical wedge 1 is given by the following formula 8. In the formula 8, z represents the distance from the tip portion 15 on the z axis.

$$d = z^*\tan\alpha \quad \text{(formula 8)}$$

Next, experiments performed about what interference fringes take place with light beams reflected by the optical wedge 1 and focused on the intensities of the light beams having two wavelengths will be described. In the experiments, it is assumed that the light beams have the lower limit wavelength ($\lambda 1$) and the upper limit wavelength ($\lambda 2$) that vary in a saw shape that are typical in the external cavity type semiconductor laser. It is assumed that $\lambda 1$ is 410.00 nm and $\lambda 2$ is 410.04 nm. In addition, it is assumed that the index of refraction, n, is 1.5, the incident angle, θ, is 45 degrees, and the wedge angle α of the optical wedge 1 is 0.02 degree.

Figure 8:
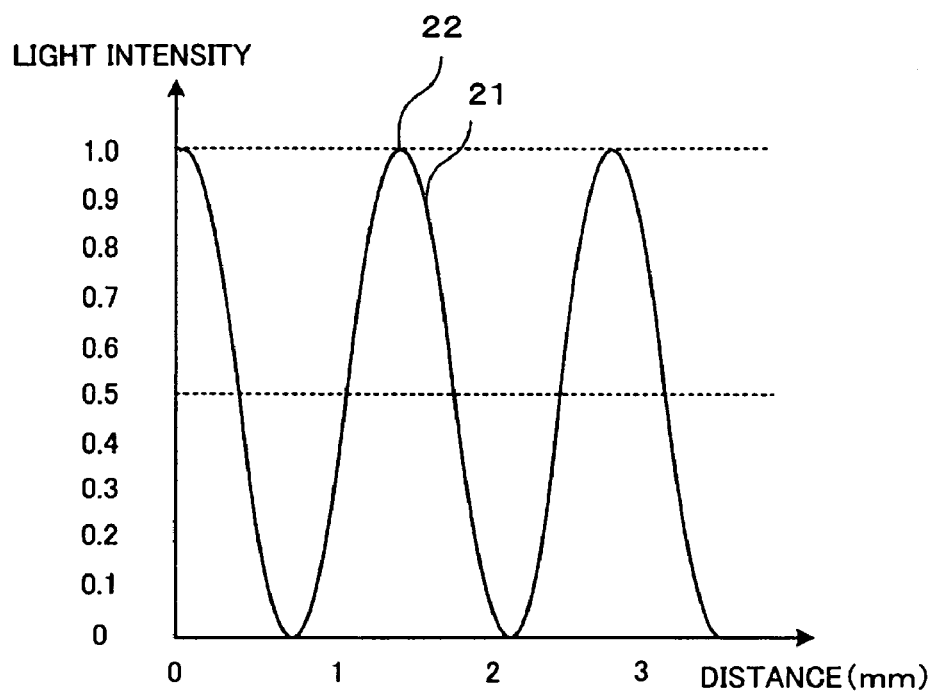
FIG. 8 is a graph showing the relationship between the intensities of light beams reflected by the optical wedge, the light beams having wavelengths $\lambda 1$ and $\lambda 2$.

FIG. 8 is a graph showing the relationship between the incident positions on the optical wedge 1 of the light beams having the wavelengths $\lambda 1$ and $\lambda 2$ and the intensities of the reflected light beams. The vertical axis represents the relative light intensity, whereas the horizontal axis represents the distance of the incident position of a light beam from the tip portion 15 of the optical wedge 1 in the z axis direction shown in FIG. 7. FIG. 8 shows the relationship between the incident positions of light beams having wavelengths $\lambda 1$ and $\lambda 2$ and the intensities of the reflected light beams, the incident positions ranging from the tip portion 15 of the optical wedge 1 to around 3 mm of the optical wedge 1. As described above, when images of reflected beams are formed, bright fringes and dark fringes are alternately formed at high intensity positions and low intensity positions, respectively. Since bright fringes and dark fringes alternately formed, interference fringes take place. In this case, since the two wavelengths $\lambda 1$ and $\lambda 2$ are very close and these light beams are emitted to portions close to the tip portion 15 of the optical wedge 1, the optical path difference is very small. Thus, a curve 21 that represents the intensity of the reflected light beam of the light beam having the wavelength of $\lambda 1$ is almost the same as a curve 22 that represents the intensity of the reflected light beam of the light beam having the wavelength of $\lambda 2$. As a result, the interference fringes appear to overlap.

Figure 9:
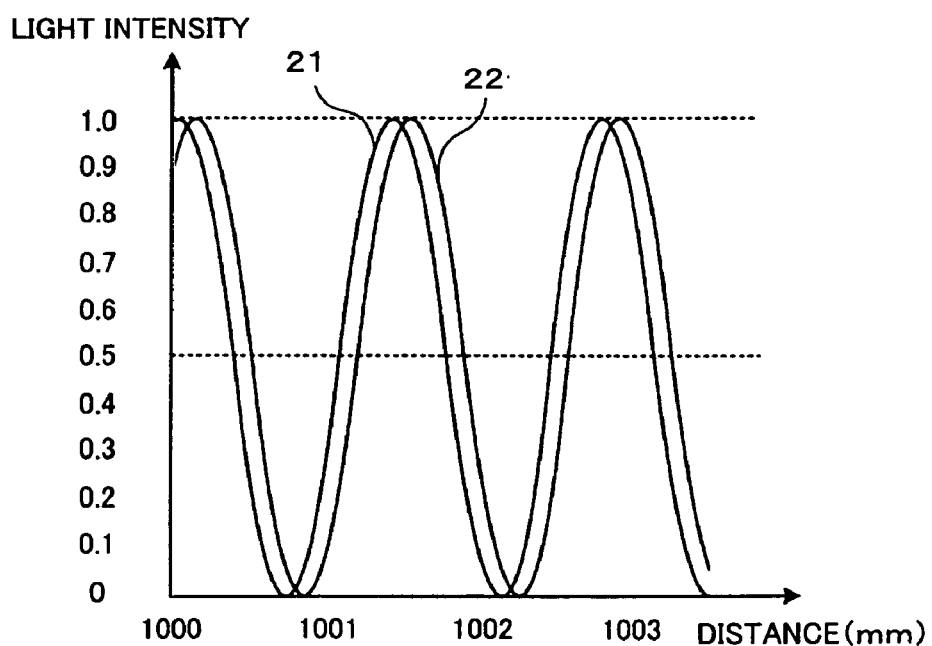
FIG. 9 is another graph showing the relationship between the intensities of light beams reflected by the optical wedge, the light beams having wavelengths $\lambda 1$ and $\lambda 2$.

Like the graph shown in FIG. 8, FIG. 9 shows how the intensities of reflected light beams of light beams that enter the optical wedge 1 vary in the case that the incident positions of the light beams are around 1000 mm (1 m) apart from the tip portion 15 of the optical wedge 1. Although the incident positions are 1000 mm (1 m) from the tip portion 15 of the optical wedge 1, it does not mean that the optical wedge needs a length of 1 m. As described above, since a portion that is cut in a trapezoidal shape from the tip portion 15 by around 1 m, the size of the optical wedge can be decreased.

In the position apart from the tip portion 15 of the optical wedge 1 by around 1 m, the thickness d of the optical wedge 1 is large. In this case, the difference of the wavelengths $\lambda 1$ and $\lambda 2$ becomes 0.04 nm. The difference of the wavelengths causes a slight phase difference to take place between the curve 21 and the curve 22. Since the phase difference is small, the interference fringes of the curve 21 are almost the same as those of the curve 22.

This results were obtained from experiments using the light beams having the wavelengths of $\lambda 1$ and $\lambda 2$. Based on the experimental results, it is assumed that a light beam whose wavelength varies in a saw shape is emitted to the optical wedge 1. In addition, the lower limit and upper limit of the wavelengths that vary are denoted by $\lambda 1$ and $\lambda 2$, respectively. As a result, the curve 21 of the reflected light having the wavelength of $\lambda 1$ takes place. As the laser power of the semiconductor laser is gradually increased, the wavelength gradually varies from $\lambda 1$ to $\lambda 2$. As a result, the curve 21 approximates to the curve 22. Thereafter, as the laser power is further increased, both the curve 21 and the curve 22 coexist.

Thereafter, only the curve 21 of the reflected light beam having the wavelength of λ1 takes place. Thereafter, as the laser power is increased, the variation of interference fringes (namely, the distribution of intensities of a light beam) is periodically observed.

Figure 10:
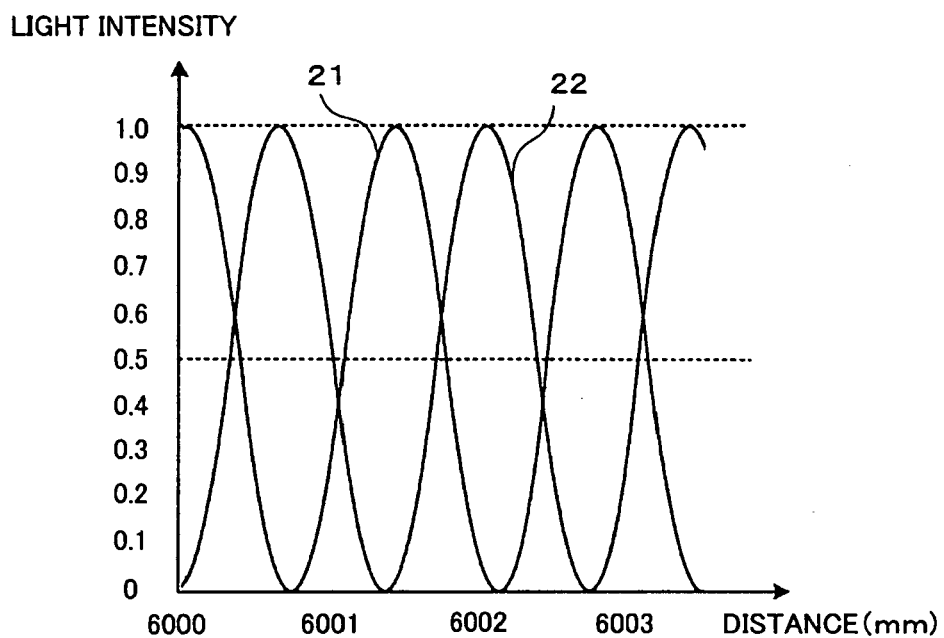
FIG. 10 is another graph showing the relationship between the intensities of light beams reflected by the optical wedge, the light beams having wavelengths $\lambda 1$ and $\lambda 2$.

Like the graph shown in FIG. 8, FIG. 10 shows how the intensities of reflected light beams of light beams that enter the optical wedge 1 vary in the case that the incident positions of the light beams are around 6000 mm (6 m) from the tip portion 15 of the optical wedge 1. In this case, the phase of a curve 21 that represents the intensity of a reflected light beam having a wavelength of λ1 is almost reverse of the phase of a curve 22 that represents the intensity of a reflected light beam having a wavelength of λ2. When both the light beams enter the optical wedge 1, it becomes difficult to observe interference fringes.

In the state shown in FIG. 9, when the wedge angle α is varied from 0.02 degrees to 0.04 degrees, the periods of the curve 21 and the curve 22 become short. Thus, the number of fringes in the same length becomes larger than that shown in FIG. 9. Thus, by adjusting the incident positions of light beams on the optical wedge, the wedge angel α, and so forth, the pattern of interference fringes can be freely adjusted.

Figure 11:
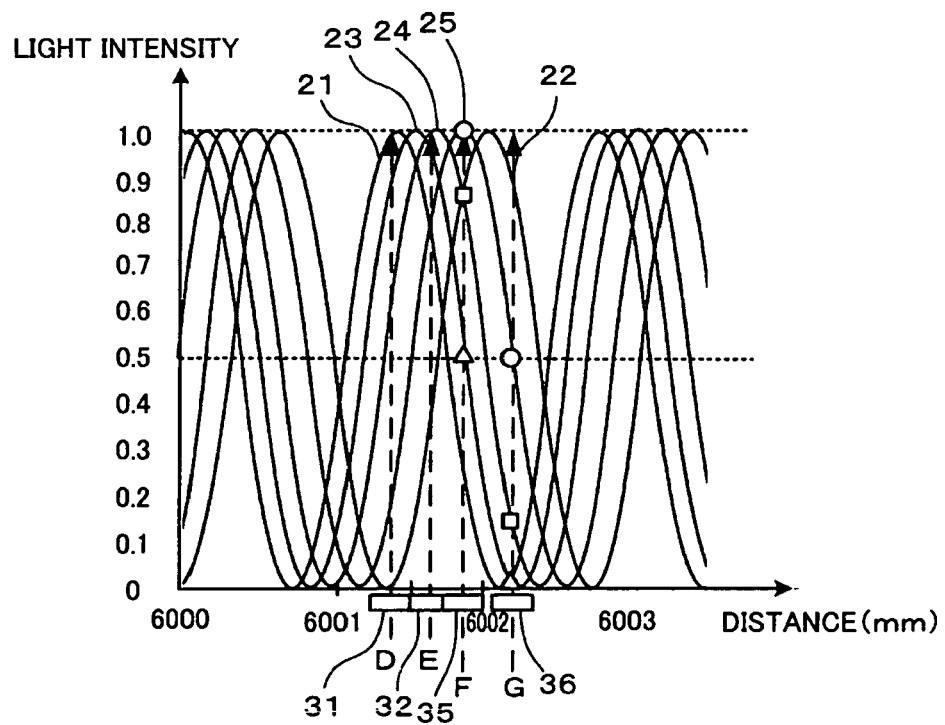
FIG. 11 is a graph showing the relationship between the intensities of light beams reflected by the optical wedge, the light beams having wavelengths $\lambda 1$, $\lambda 2$, $\lambda 3\lambda$, $\lambda 4$, and $\lambda 2$.

Next, with reference to FIG. 11, push-pull values obtained from light beams reflected from the optical wedge 1 will be described. In FIG. 11, in addition to the curve 21 of the upper limit wavelength (λ1) and the curve 22 of the lower limit wavelength (λ2), curves of light beams having wavelengths of λ3 (410.01 nm), λ4 (410.02 nm), and λ5 (410.03 nm) are denoted by curves 23, 24, and 25, respectively. In this case, it is assumed that the conditions of the shape of the optical wedge 1, the wedge angle α, and so forth are the same as those shown in FIG. 10.

In this example, a first detector 31 and a second detector 32 that each have a width of 0.3 mm are arranged in a row at a position (z) apart from the tip portion 15 of the optical wedge 1 by 6001.6 mm so that the first detector 31 and the second detector 32 are in contact at the position (z). The first detector 31 and the second detector 32 generate a push-pull signal. The push-pull value represents the difference of light intensities detected by the first detector 31 and the second detector 32. The position of the light beam detected by the first detector 31 is denoted by arrow D, whereas the position of the light beam detected by the second detector 32 is denoted by arrow E. Normally, the push-pull value is used for the tracking control of the optical disc. On the basis of the push-pull signal, which represents the push-pull value, the pickup is pushed or pulled. According to an embodiment of the present invention, a predetermined element is neither pushed, nor pulled on the basis of the push-pull signal. However, because of the commonness with a difference signal, the term push-pull signal is expediently used.

Figure 12:
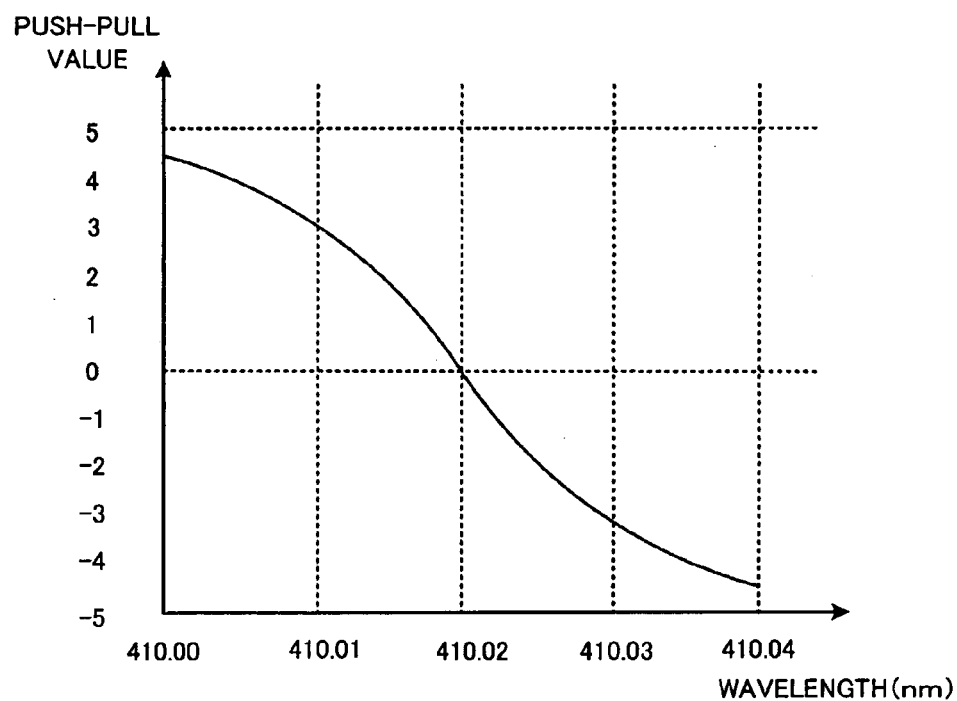
FIG. 12 is a graph showing the variation of a push-pull value calculated on the basis of detected values of two detectors.

As the detected results of the detector 31 and the detector 32, a push-pull value corresponding to a wavelength is obtained as shown in FIG. 12. In this case, it is assumed that a light beam having a wavelength is emitted to the position z of the optical wedge 1.

Figure 13:
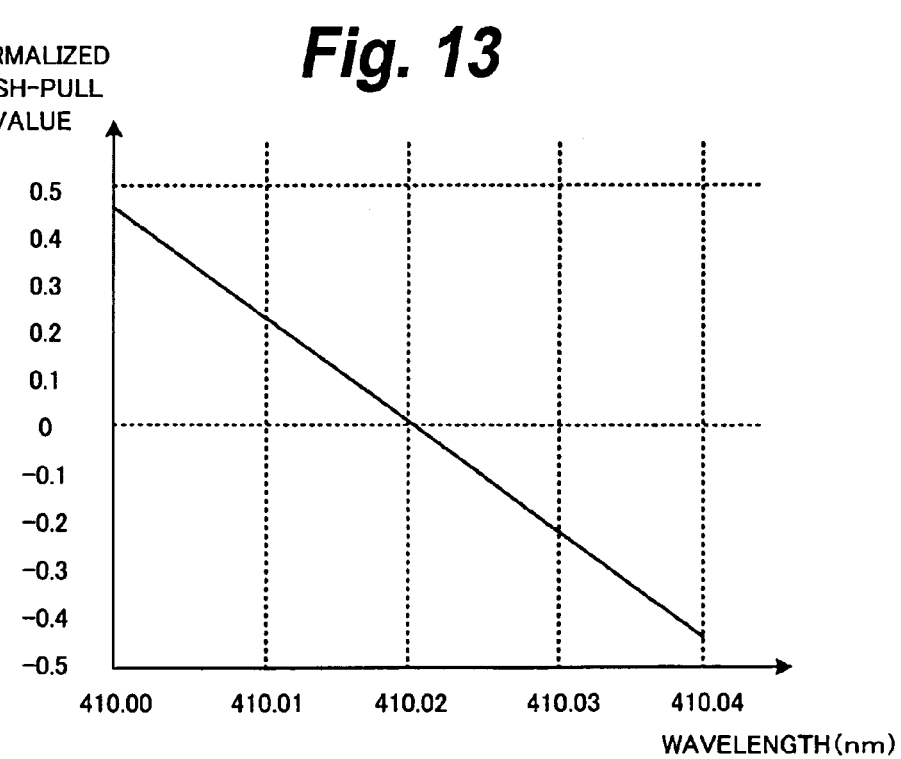
FIG. 13 is a graph showing the relationship between the push-pull value shown in FIG. 12 and its normalized value.

The push-pull value also varies as the amount of light increases or decreases. Thus, it is preferred that the push-pull value should be normalized with a sum signal. FIG. 13 shows the relationship between the normalized push-pull value and the wavelength.

Figure 1:
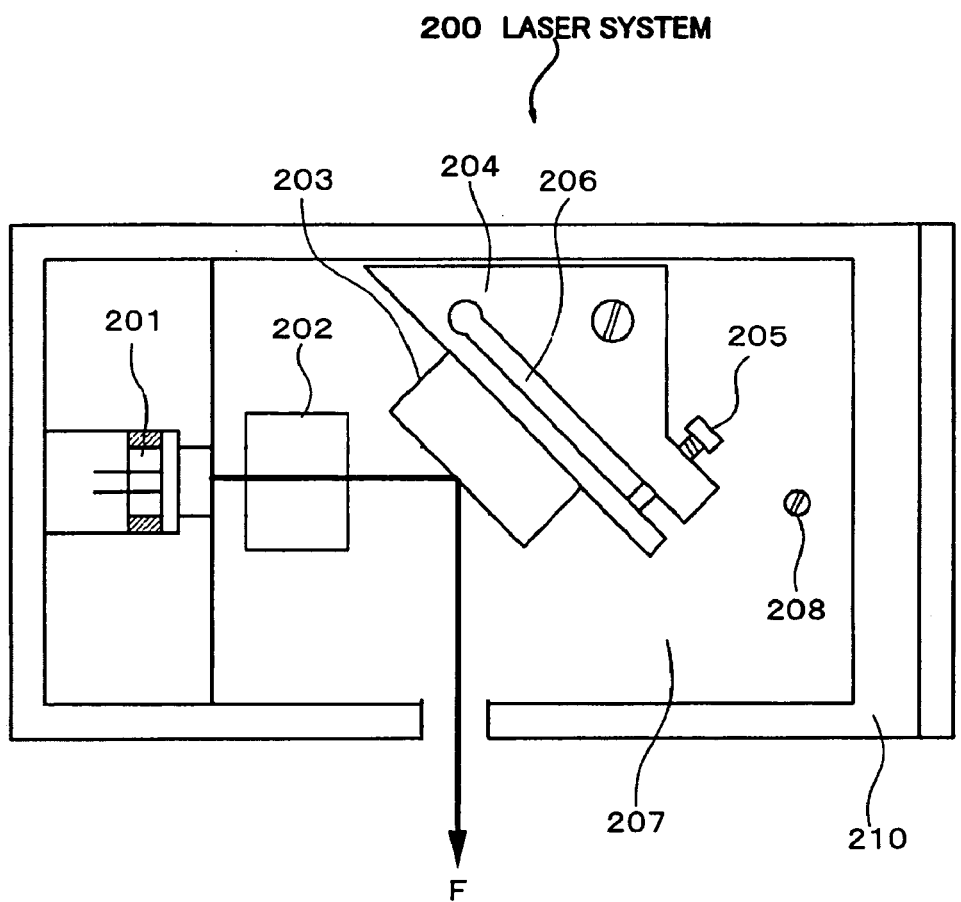
FIG. 1 is a schematic diagram showing a structure of a Littrow external cavity type semiconductor laser.
Figure 2:
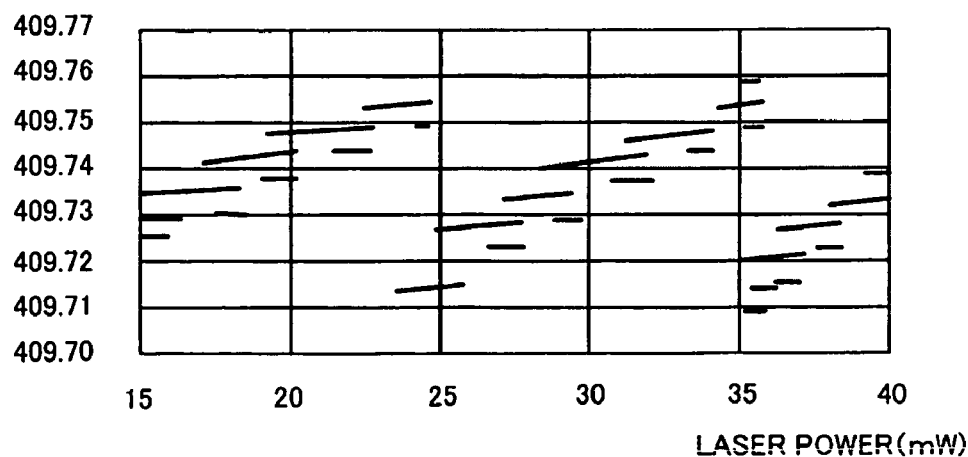
FIG. 2 is a graph showing the relationship between the wavelength of a laser light beam emitted from the external cavity type semiconductor laser and the laser power.
Figure 3A:
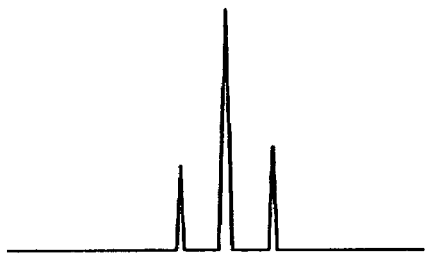
FIG. 3A, FIG. 3B, FIG. 3C, and FIG. 3D are schematic diagrams showing patterns of modes of laser light beams emitted from the external cavity type semiconductor laser.
Figure 3B:
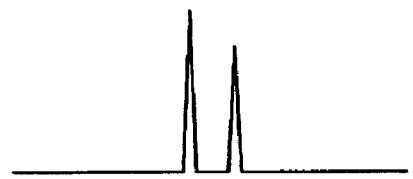
Figure 3C:
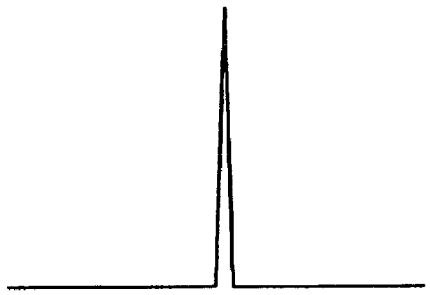
Figure 3D:
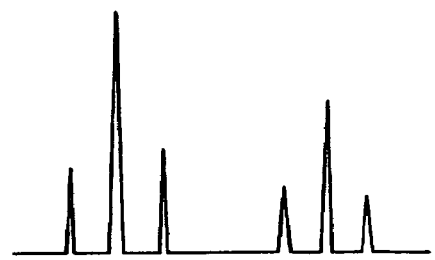
Figure 14:
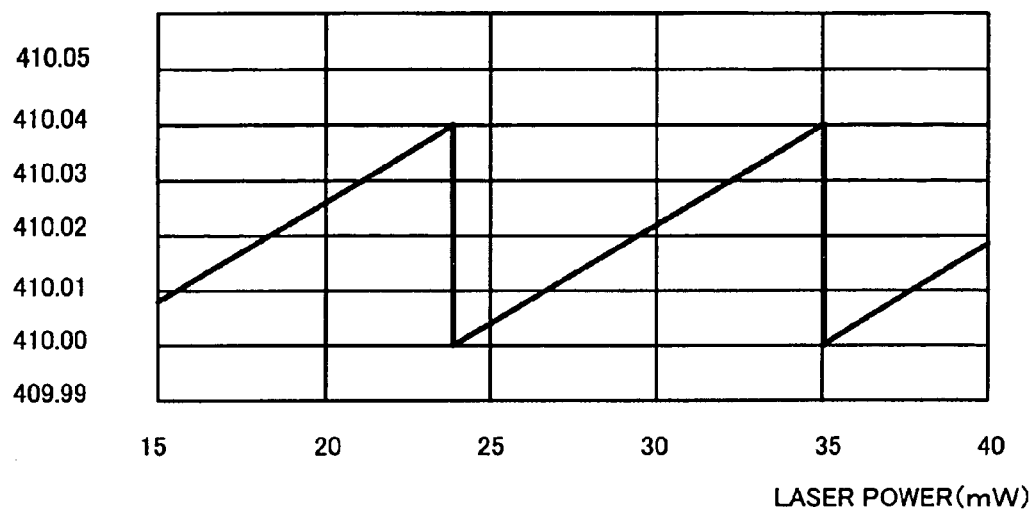
FIG. 14 is a graph showing the relationship between the laser power of a laser light beam of the external cavity type semiconductor laser and the wavelength thereof.

Next, the relationship between the wavelength of a light beam of an external cavity type semiconductor laser and the push-pull value will be described. Now, as shown in FIG. 14, it is assumed that there is an external cavity type semiconductor laser that emits a light beam whose wavelength varies in a saw shape corresponding to the laser power. Like the graph shown in FIG. 2, FIG. 14 shows the variation of the wavelength. In other words, as the laser power increases, the wavelength varies from 410.00 nm to 410.04 nm. When the laser power becomes for example around 23 mW and 35 mW, the wavelength sharply varies and returns to 410.00 nm. The laser repeats this operation. When the wavelength sharply varies, a light beam having a wavelength of around 410.00 nm and a light beam having a wavelength of around 410.04 nm coexist. As a result, these light beams are not suitable for hologram recording and so forth (light beams having an unusable mode).

Figure 15:
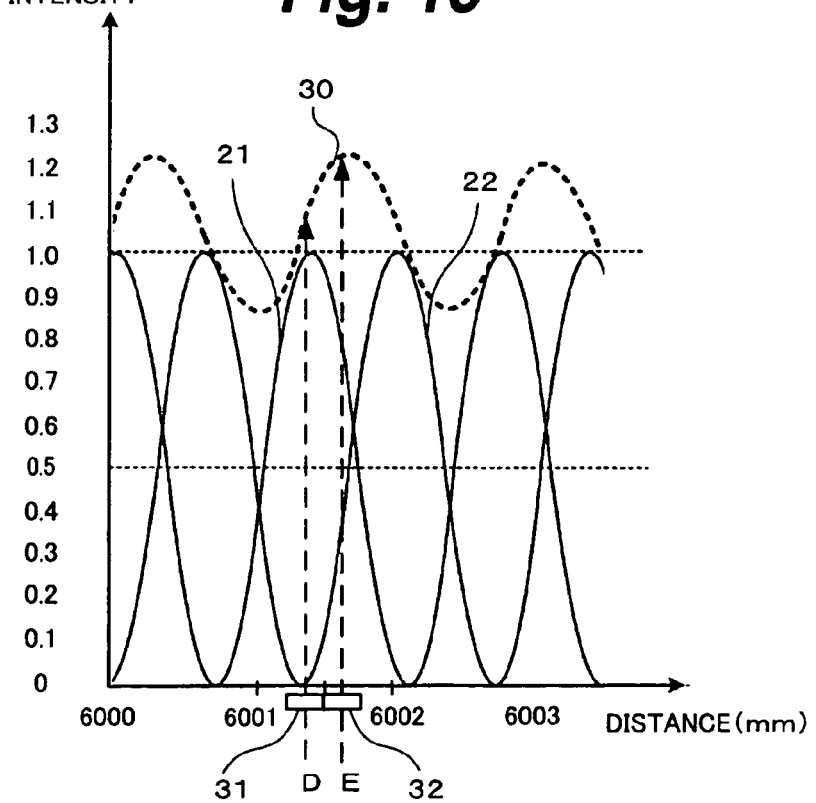
FIG. 15 is a graph showing the intensities of light beams emitted from the external cavity type semiconductor laser and reflected by the optical wedge in the case that laser light beams having the upper limit wavelength and the lower limit wavelength.

When the wavelengths sharply vary, namely a light beam having a wavelength of 410.00 nm (λ1) and a light beam having a wavelength of 410.04 nm (λ2) coexist, with the detector 31 and the detector 32 arranged as shown in FIG. 11, a push-pull value is obtained. In FIG. 15, the amount of light of the light beam having a wavelength of λ1 is denoted by a curve 21 and the amount of light of the light beam having a wavelength of λ2 is dented by a curve 22. Since the phase of the curve 21 is almost reverse of the phase of the curve 22, the intensities of these light beams do not largely vary when the incident positions of the light beams emitted to the optical wedge 1 vary. The detected results of the detector 31 and the detector 32 represent that the amount of light detected by the detector 31 is almost the same as that detected by the detector 32 and the push-pull value becomes a value close to 0.

Figure 16:
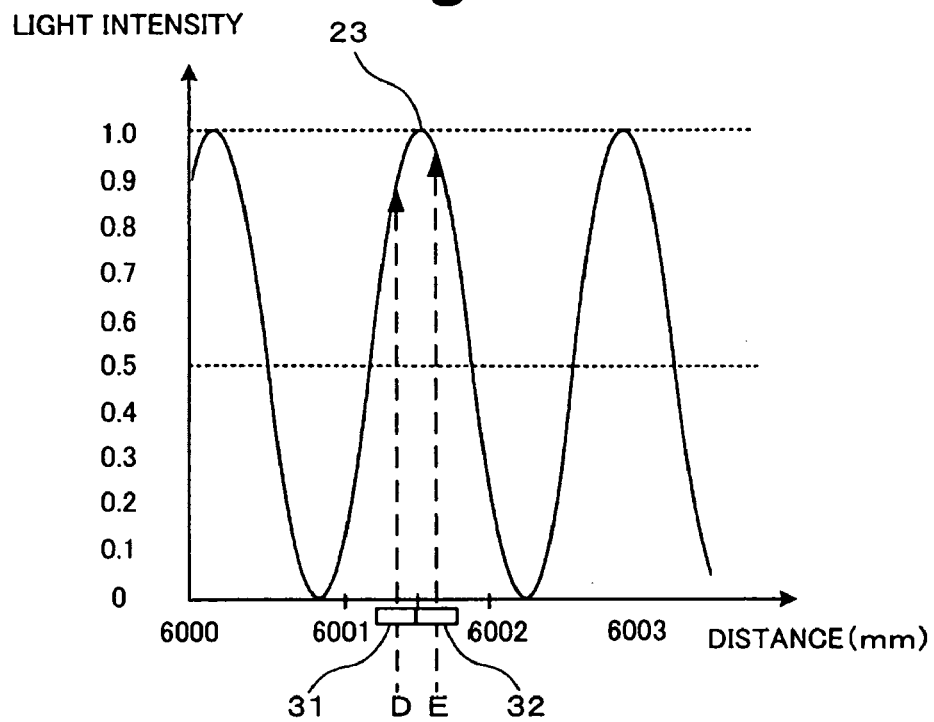
FIG. 16 is a graph showing the relationship between the intensity of a light beam reflected by the optical wedge and a detector, the light beam having a wavelength of $\lambda 3$.

On the other hand, when the wavelength of a light beam that is emitted from the external cavity type semiconductor laser simply increases as the laser power increases (namely, the laser beam has a usable mode), the laser beam has a single mode. Alternatively, the laser beam has two modes or three modes whose wavelengths are very close. Thus, in this case, it is assumed that a light beam having a wavelength that forms a typical peak is emitted. When the wavelength of the light beam is 410.01 nm (λ3), as shown in FIG. 16, the amount of light detected by the detector 31 is largely different from that detected by the detector 32 and the push-pull value also becomes large.

Figure 17:
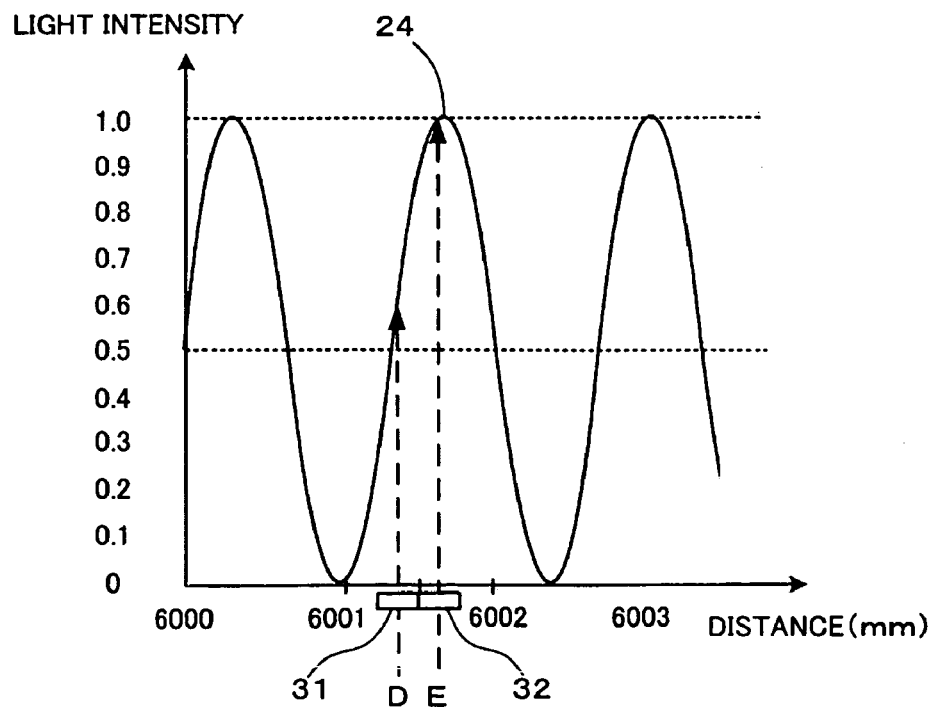
FIG. 17 is a graph showing the relationship between the intensity of a light beam reflected by the optical wedge and a detector, the light beam having a wavelength of $\lambda 4$.
Figure 18:
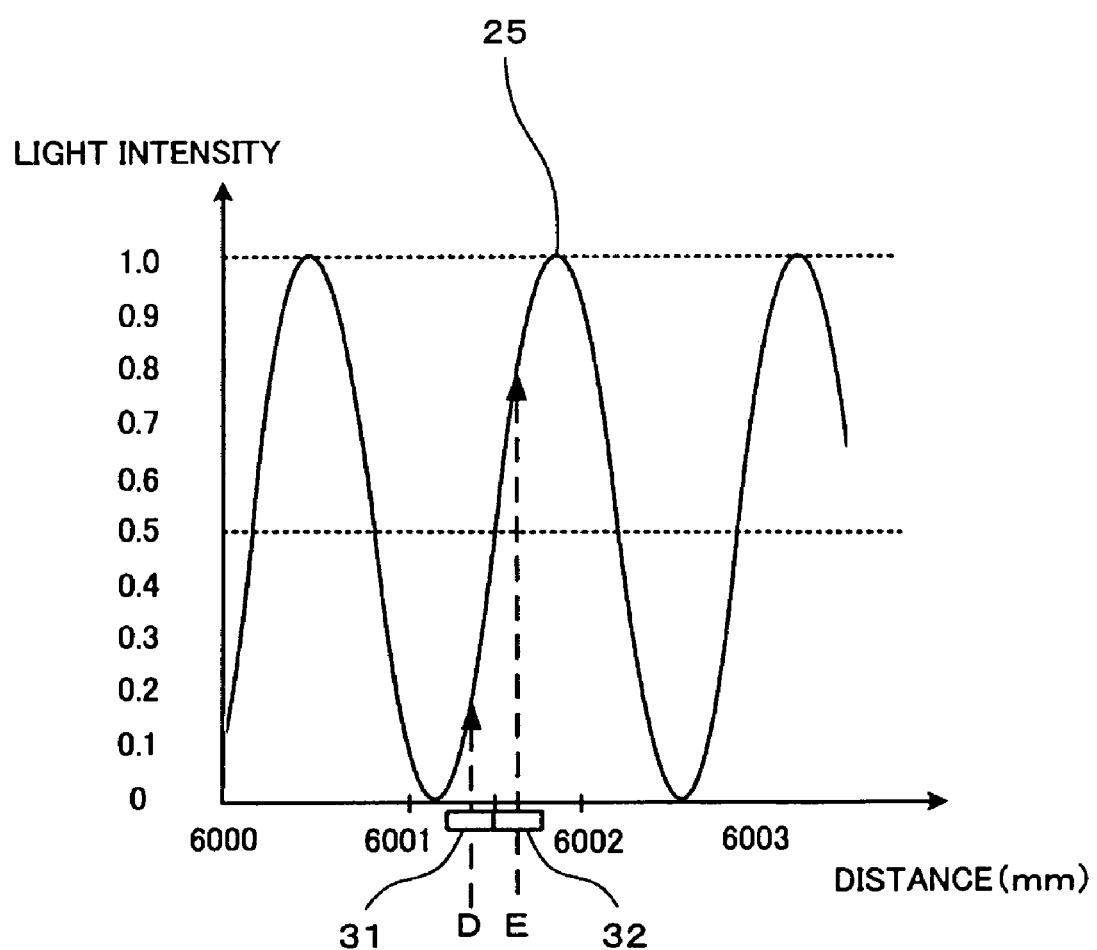
FIG. 18 is a graph showing the relationship between the intensity of a light beam reflected by the optical wedge and a detector, the light beam having a wavelength of $\lambda 5$.

Likewise, FIG. 17 shows the amounts of light detected for a light beam having a wavelength of 410.09 nm (λ4) by the detector 31 and the detector 32. In this case, there is a large difference between the amounts of light detected by these detectors. Like the case shown in FIG. 15, the detectors obtain a push-pull value close to 0. FIG. 18 shows the amounts of lights detected for a light beam having a wavelength of 410.03 nm (λ5) by the detector 31 and the detector 32. Like the case shown in FIG. 16, there is a difference between the amounts of light detected by these detectors. As a result, the detectors obtain a relatively large push-pull value.

Thus, it is clear that a push-pull value obtained assuming that the wavelength of a laser beam emitted from the external cavity type semiconductor laser varies becomes close to 0 when the wavelength is 410.00 nm (410.04 nm) and 410.02 nm. However, the push-pull values plotted corresponding to wavelengths shown in FIG. 12 and FIG. 13 show that light beams that have wavelengths of 410.00 nm and 410.04 nm have large push-pull values. In addition, it is clear that light beams having wavelengths in the mode hop region of the external cavity have different push-pull values.

Thus, according to an embodiment of the present invention, it is determined whether the wavelength of a laser light beam becomes close to 410.00 nm (or 410.04 nm) with a push-pull value obtained in the mode hop region of the external cavity. When the wavelength of the laser beam became close to 410.00 nm (or 410.04 nm), the laser power of the semiconductor laser is varied by a predetermined value so as to prevent laser beams having these wavelengths from coexisting (namely, laser beams having an unusable mode).

According to this theory, the wavelength of a laser light beam emitted from the external cavity type semiconductor laser can be obtained. Thus, without need to strictly control the temperature of the semiconductor laser and so forth, the wavelength of the laser light beam can be properly maintained. As described above, in the external cavity type semiconductor laser of the related art can vary the wavelength of the laser light beam by adjusting the angle of the grating with a combination of a machine screw and a piezoelectric diode. In this case, it is assumed that the angle of the grating is kept constant. The theory is effective to identify the wavelength of a laser light beam when the wavelength varies in a narrow range like the variation of the wavelength of a laser light beam emitted from the external cavity type semiconductor laser.

Next, a laser system according to an embodiment of the present invention will be described. A laser system 51 shown in FIG. 19 has a beam splitter 52, an optical wedge 53, a two-divided detector 54, and a laser control portion 55. The beam splitter 52 of the laser system 51 receives a laser light beam from an external cavity type semiconductor laser 50. The external cavity type semiconductor laser 50 is for example a Littrow type blue laser. A light beam 56 that passes through the beam splitter 52 is used for such as the HDS.

A light beam 57 is reflected by the beam splitter 52. The light beam 57 is preferably 10% or less of the laser light beam emitted from the external cavity type semiconductor laser 50. The light beam 57 is used to monitor an oscillation mode. Alternatively, a light beam reflected by the beam splitter 52 may be used for the HDS and a light beam that passes through the beam splitter 52 may be used to monitor the oscillation mode. However, in this case, the light beam that is used to monitor the oscillation mode is preferably 10% or less of a laser light beam emitted from the external cavity type semiconductor laser 50. This is because much power of a laser light beam is used for the main purpose of the laser light beam such as the HDS.

The optical wedge 53 is arranged so that the light beam 57 reflected by the beam splitter 52 enters the optical wedge 53 with an angle of around 45 degrees. The optical wedge 53 is tapered in the z axis direction so that the thickness d of the optical wedge 53 gradually decreases. The z axis direction is a direction viewed from the front surface of the drawing shown in FIG. 19 to the rear surface thereof. A light beam 58 that is reflected on the front surface of the optical wedge 53 and a light beam 58 that is reflected on the rear surface of the optical wedge 53 are received by the two-divided detector 54. The two-divided detector 54 has two adjacent independent detectors. The two detectors of the two-divided detector 54 that monitors interference fringes are arranged almost perpendicular to the generated interference fringes. Since the interference fringes do not always take place perpendicular to the z axis, the two detectors may not be arranged in the z direction.

The laser control portion 55 obtains the wavelength of the laser light beam emitted from the external cavity type semiconductor laser 50 and determines the laser power supplied to the semiconductor laser of the external cavity type semiconductor laser 50 so as to prevent the laser from emitting a laser light beam having a unusable mode. The laser control portion 55 will be described later.

Figure 19:
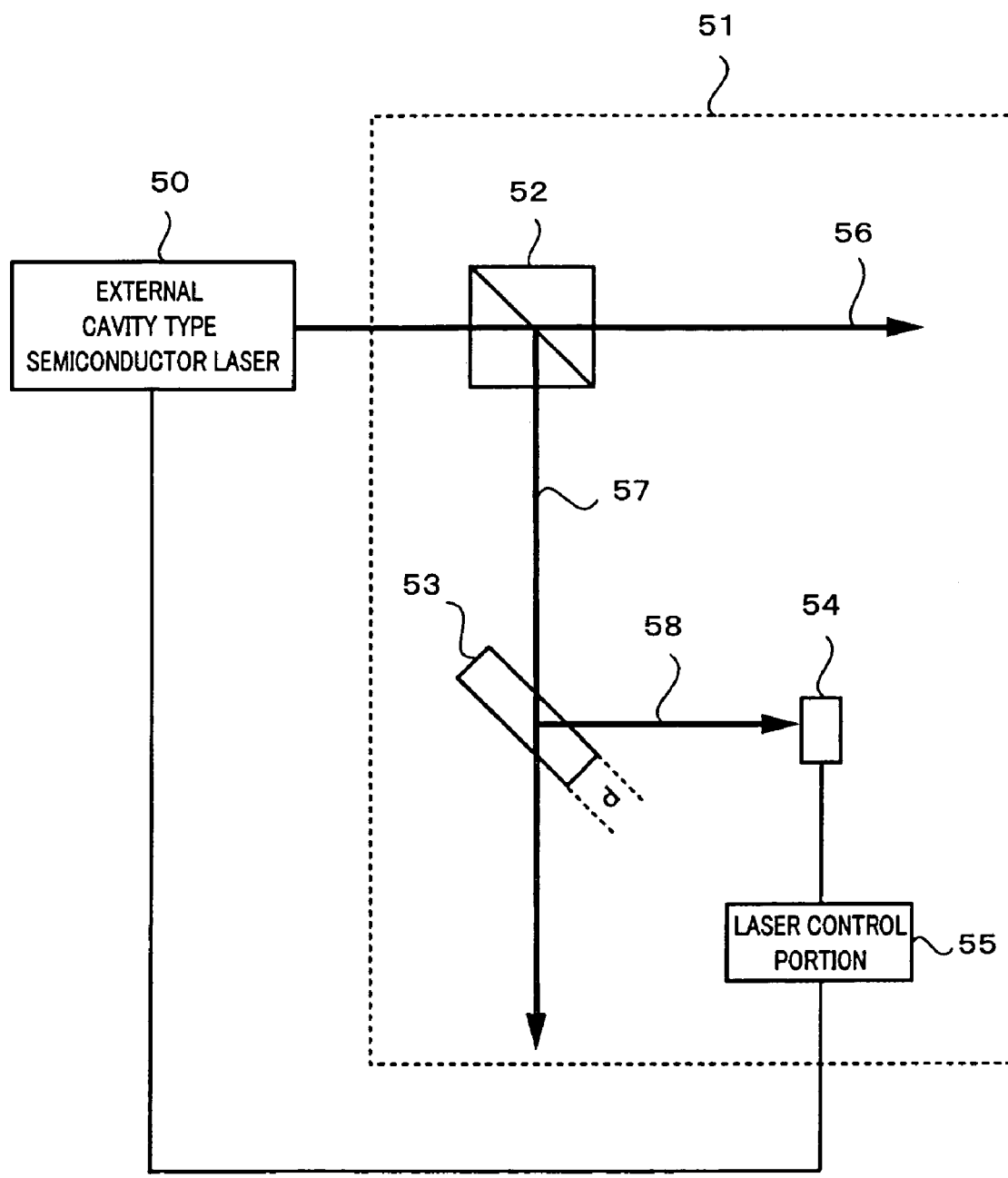
FIG. 19 is a schematic diagram showing a structure of a laser system according to an embodiment of the present invention.

In the example shown in FIG. 19, the laser system 51 is disposed outside the external cavity type semiconductor laser 50. Alternatively, the laser system 51 may be disposed in the external cavity type semiconductor laser 50.

Figure 20:
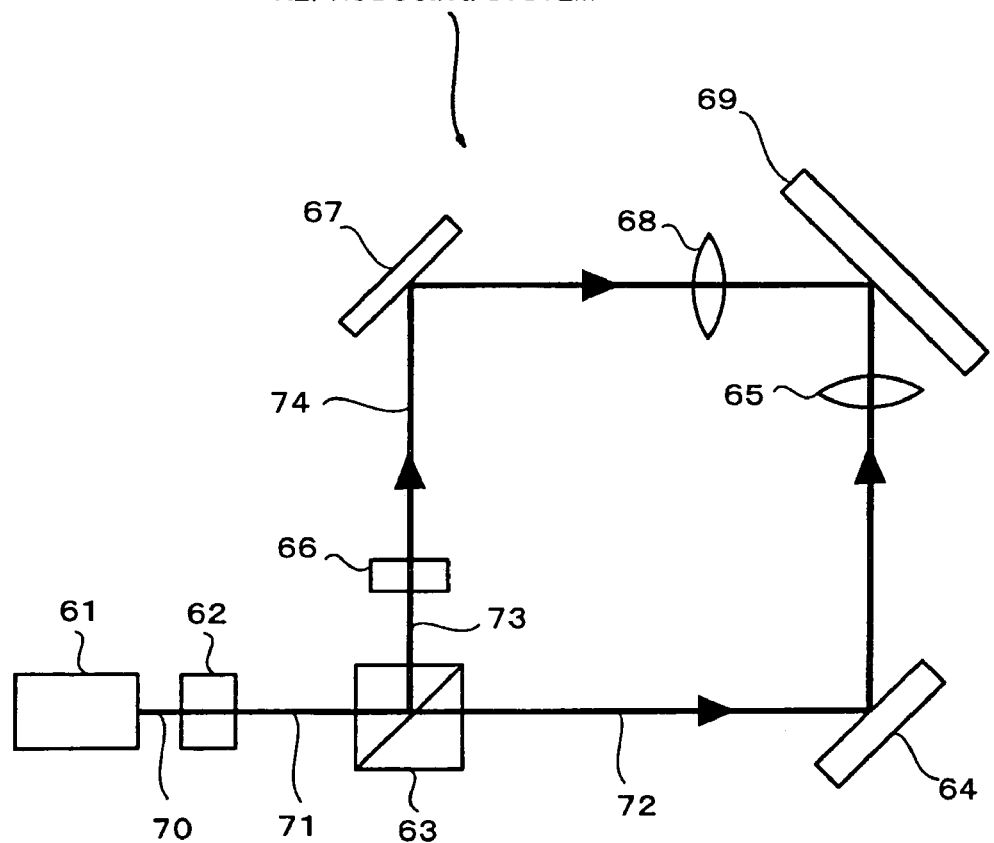
FIG. 20 is a schematic diagram showing a structure of a hologram recording and reproducing system that uses the laser system shown in FIG. 19.

Next, with reference to FIG. 20, how the light beam 56 that passes through the beam splitter 52 is used for the HDS will be described in brief. FIG. 20 shows a structure of a hologram recording and reproducing system 60 that records and reproduces a hologram with a laser light source having a single mode.

A hologram is recorded and reproduced in such a manner that a reference light beam and a signal light beam are emitted to a hologram recording medium with a light source of a single-mode laser.

A laser light source 61 corresponds to a block that has the external cavity type semiconductor laser 50 and the laser system 51. A laser light beam 71 emitted from a laser light source 61 corresponds to the light beam 56 shown in FIG. 19. When a hologram is recorded, a laser light beam having a predetermined power needs to be emitted to a hologram recording medium for a predetermined time period. This recording is performed by controlling a current (voltage) supplied to the semiconductor laser of the external cavity type semiconductor laser 50. Alternatively, a shutter may be disposed adjacent to the laser light source 61 to control the timing at which a laser light beam is emitted.

The laser light beam 70 emitted from the laser light source 61 is emitted to a beam expander 62. The beam expander 62 expands the diameter of the light beam and outputs a laser light beam 71. The laser light beam 71 enters a beam splitter 63. The beam splitter 63 divides the laser light beam 71 into two laser light beams.

One of the two laser light beams, a laser light beam 72, travels straightly to a mirror 64. The mirror 64 reflects the laser light beam 72. The reflected light beam is collimated by a lens 65. The collimated light beam, a reference light beam, is emitted to a hologram recording medium 69. The other divided light beam, a laser light beam 73, is modulated by a spatial modulator 66. The spatial modulator 66 is composed of a liquid crystal device or the like. The spatial modulator 66 outputs a signal light beam 74. The signal light beam 74 is reflected by a mirror 67. The reflected light beam is collimated by a recording lens 68. The collimated light beam is emitted to the hologram recording medium 69. At this point, the signal light beam 74 and the laser light beam 72 are emitted to the same position of the hologram recording medium 69. As a result, a hologram pattern is recorded on the hologram recording medium 69.

In the hologram recording and reproducing system 60, holograms can be multiplex recorded and reproduced with the same region of the hologram recording medium 69. When holograms are recorded with reference light beams having different incident angles to the hologram recording medium 69, they are reproduced with the same reference light beams as the holograms were recorded. Although the spatial modulator 66 is a liquid crystal device that has a plurality of pixels, when the plurality of pixels have different transmission and insulation patterns, desired data can be multiplex-recorded on the hologram recording medium 69.

Figure 21:
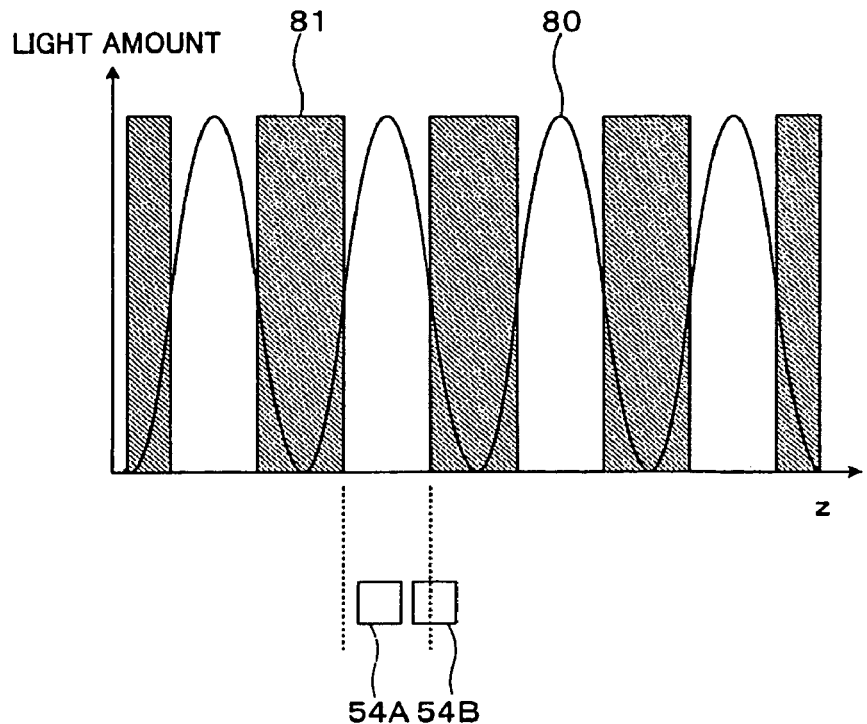
FIG. 21 is a schematic diagram describing the relationship between the positions of two detectors and interference fringes.

Next, with reference to FIG. 21, the relationship between the positions of the two detectors of the two-divided detector 54 shown in FIG. 19 and the interference fringes will be described. FIG. 21 shows a graph 80 that represents a light beam 58 reflected on the front surface and the rear surface of the optical wedge 53. The horizontal axis of the graph corresponds to the z axis shown in FIG. 19, whereas the vertical axis corresponds to the amount of light (light intensity) of the light beam 58. The curve 80 is an example of a particular wavelength. When the laser power of the semiconductor laser of the external cavity type semiconductor laser 50 is varied, the wavelength varies. Correspondingly, the phase in the graph 80 shown in FIG. 11 varies. FIG. 21 also shows a detector 54A and a detector 54B of the two-divided detector 54. The amounts of light are detected at the positions of the detector 54A and the detector 54B.

In the curve 80, a portion of which the light amount is small is denoted by a region 81. This portion corresponds to dark portions of interference fringes. In the state shown in FIG. 21, the detector 54A is arranged at a portion of which the amount of light is large in the graph 80. As a result, the detector 54A detects a large amount of light. On the other hand, the detector 54B is arranged at a portion of which the amount of light is small (this portion is partly overlaps with the region 81) in the graph 80. When the difference between the detected result of the detector 54A and the detected result of the detector 54B is obtained, a push-pull value can be obtained. As a result, the corresponding wavelength can be obtained. This theory was described in FIGS. 12 and 13.

In addition, when laser light beams having reverse phases coexist as shown in FIG. 15, the amount of light does not largely vary on the z axis. Thus, interference fringes do not clearly appear. In this case, the difference between the detected result of the detector 54A and the detected result of the detector 54B becomes almost 0. On the other hand, depending on the positions of the detector 54A and the detector 54B, there is a possibility of which there is a wavelength of which the difference of the detected results becomes almost 0 between the upper limit wavelength and the lower limit wavelength of the external cavity type semiconductor laser 50 (for example, in the example shown in FIG. 12 and FIG. 13 is 410.02 nm). In other words, a laser light beam having a unusable mode and a laser light beam having an usable mode may have a push-pull value of almost 0. However, in the foregoing two cases, such a wavelength can be effectively identified by determining adjacent push-pull values as will be described later.

Figure 22:
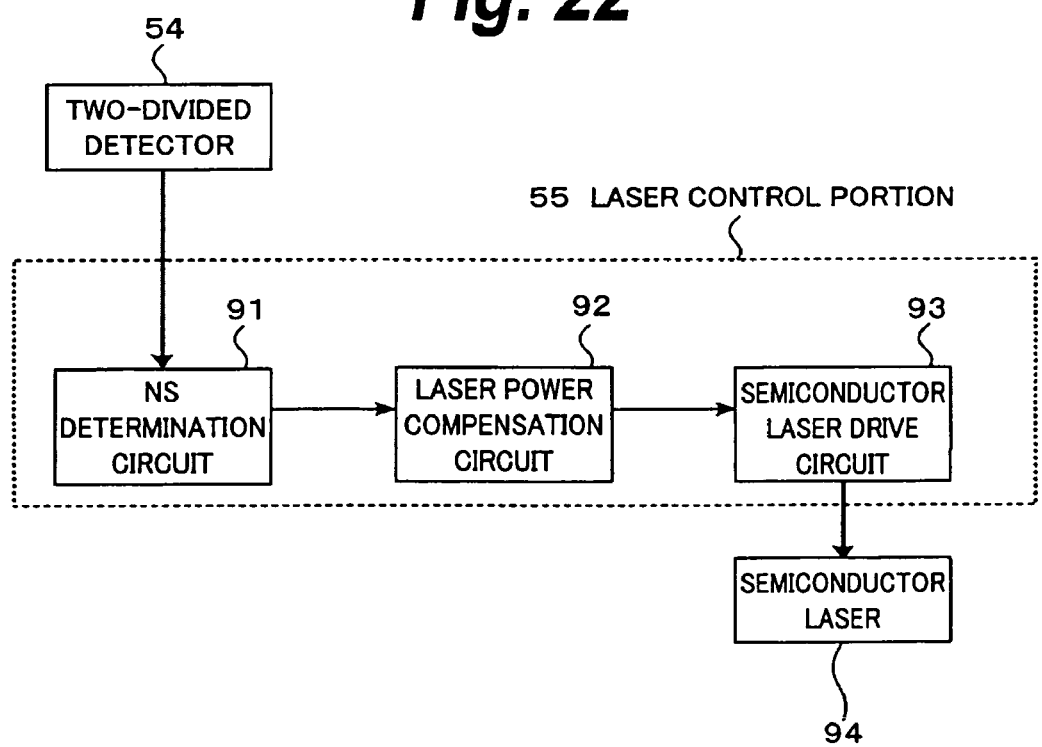
FIG. 22 is a block diagram showing a structure of a laser control portion of the laser system according to the embodiment shown in FIG. 19.

Next, with reference to FIG. 22, the structure of the laser control portion 55 will be described. The laser control portion 55 is connected to the two-divided detector 54 and a semiconductor laser 94 disposed in the external cavity type semiconductor laser 50. In addition, the laser control portion 55 includes an NS determination circuit 91, a laser power compensation circuit 92, and a semiconductor laser drive circuit 93.

The detector 54A and the detector 54B of the two-divided detector 54 output currents corresponding to the laser powers of light beams to the NS determination circuit 91 of the laser control portion 55. The NS determination circuit 91 obtains the difference and the sum of the output of the detector 54A and the output of the detector 54B. Thereafter, the NS determination circuit 91 obtains a normalized difference signal (hereinafter, referred to as the NS). The NS is given by the following formula 9.

NS=difference signal/sum signal (formula 9)

Thereafter, the value of the NS is compared with a predetermined range. When the value of the NS does not exceed the predetermined range, a digital value 1 is output. In contrast, when the value of the NS exceeds the predetermined range, a digital value 0 is output. It is assumed that the predetermined range is for example from −0.4 to 0.4. In the example shown in FIG. 13, when the value of the NS (normalized push-pull value) becomes close to 0.5, the laser light beam becomes unstable and has an unusable mode that causes the wavelength to sharply vary. However, this threshold value can be adjusted depending on the position of the detector and the curve of light beams reflected from the optical wedge. With this threshold value, the boundary of which a light beam having a wavelength in the mode hop region of the external cavity changes to a light beam having a wavelength in the mode hop region of the laser chip of the semiconductor laser can be determined. As a result, a laser light beam having a unusable mode can be prevented from being emitted.

When the output of the NS determination circuit 91 is 1, the laser power compensation circuit 92 causes the semiconductor laser drive circuit 93 to change the laser power of the semiconductor laser 94. First, for example, the semiconductor laser drive circuit 93 sets the laser power of the semiconductor laser 94 to 33 mW. Whenever the NS determination circuit 91 outputs 1, the laser power compensation circuit 92 controls the semiconductor laser drive circuit 93 to alternately decrease and increase the laser power by 3 mW.

The semiconductor laser drive circuit 93 is known as a circuit that performs an auto power control (APC). According to an embodiment of the present invention, the semiconductor laser drive circuit 93 is used.

By feeding back a laser light beam emitted by the semiconductor laser 94, the laser power of the semiconductor laser 94 can be controlled so that the laser light beam dynamically has an usable mode. Thus, when the temperatures of for example the external cavity type semiconductor laser 50 and the semiconductor laser 94 are not controlled (or the temperature are not strictly controlled), even if the temperature of the semiconductor laser 94 varies and the laser light beam is going to have a unusable mode, the laser light beam is prevented from having an unusable mode.

In the forgoing example, the laser power compensation circuit 92 varies the laser power by around 10% corresponding to the output of the NS determination circuit 91 (for example, decreases the laser power from 33 mW to 30 mW or increase the laser power from 30 mW to 33 mW). This variation of the laser power does not adversely affect the HDS. The HDS is not affected by the emission power, but the emission energy (laser power×recording time period). Thus, when the laser power decreases by 10%, the recording time period needs to be increased by around 11% (1/0.9 =1.111). Alternatively, by changing the specifications of the laser power compensation circuit 92, the variation step may be decreased.

In the case that a hologram is recorded by gradually increasing the laser power, when the output of the NS determination circuit 91 becomes 1, the laser power compensation circuit 92 causes the semiconductor laser drive circuit 93 to increase the laser power of the semiconductor laser 94 by several mW (for example, around 1 to 3 mW) in addition to the regular laser power increase routine so that the laser light beam is prevented from having a unusable mode in which the wavelength becomes unstable.

It is assumed that the wavelength of a laser light beam emitted from the external cavity type semiconductor laser varies as shown in FIG. 14 with an increase of the laser power (at this point, it is assumed that the wavelength of the laser light beam does not vary with an increase of the temperature of the semiconductor laser). When a laser power of around 18 mW is supplied, a laser light beam having a wavelength of 410.02 nm is emitted. As the laser power increases, the wavelength of the laser light beam increasingly approaches to 410.04 nm. Thus, the value of the NS calculated with the detected results of the two detectors becomes −0.4 or smaller. Thus, it is determined that the wavelength of the laser light beam is approaching to an unstable region. As a result, the laser power compensation circuit 92 causes the semiconductor laser drive circuit 93 to straightly increase the laser power by several mW. As a result, the region of around 24 mW is skipped. The laser light beam has a wavelength slightly larger than 410.00 nm, which is a stable wavelength.

Thereafter, the laser power gradually increases and becomes close to 35 mW. At this point, the value of the NS calculated with the detected results of the two detectors becomes −0.4 or smaller. Thus, it is determined that the wavelength of the laser light beam is approaching to an unstable region. As a result, the laser power compensation circuit 92 causes the semiconductor laser drive circuit 93 to straightly increase the laser power of the semiconductor laser 94 by several mW. As a result, the region of around 35 mW is omitted. Thus, the wavelength of the laser light beam slightly exceeds 410.00 nm, which is a stable wavelength. Thereafter, the same control is repeated.

Each circuit of the laser control portion 25 may be controlled by a microcomputer that has a CPU and a memory. In this case, the operation of each circuit is controlled by a program that is loaded to the memory. When necessary, the program can be changed to another one. Alternatively, the program may be recorded to a recording device and the memory of the microcomputer through a portable recording medium such as a CD-ROM or a network.

Figure 23:
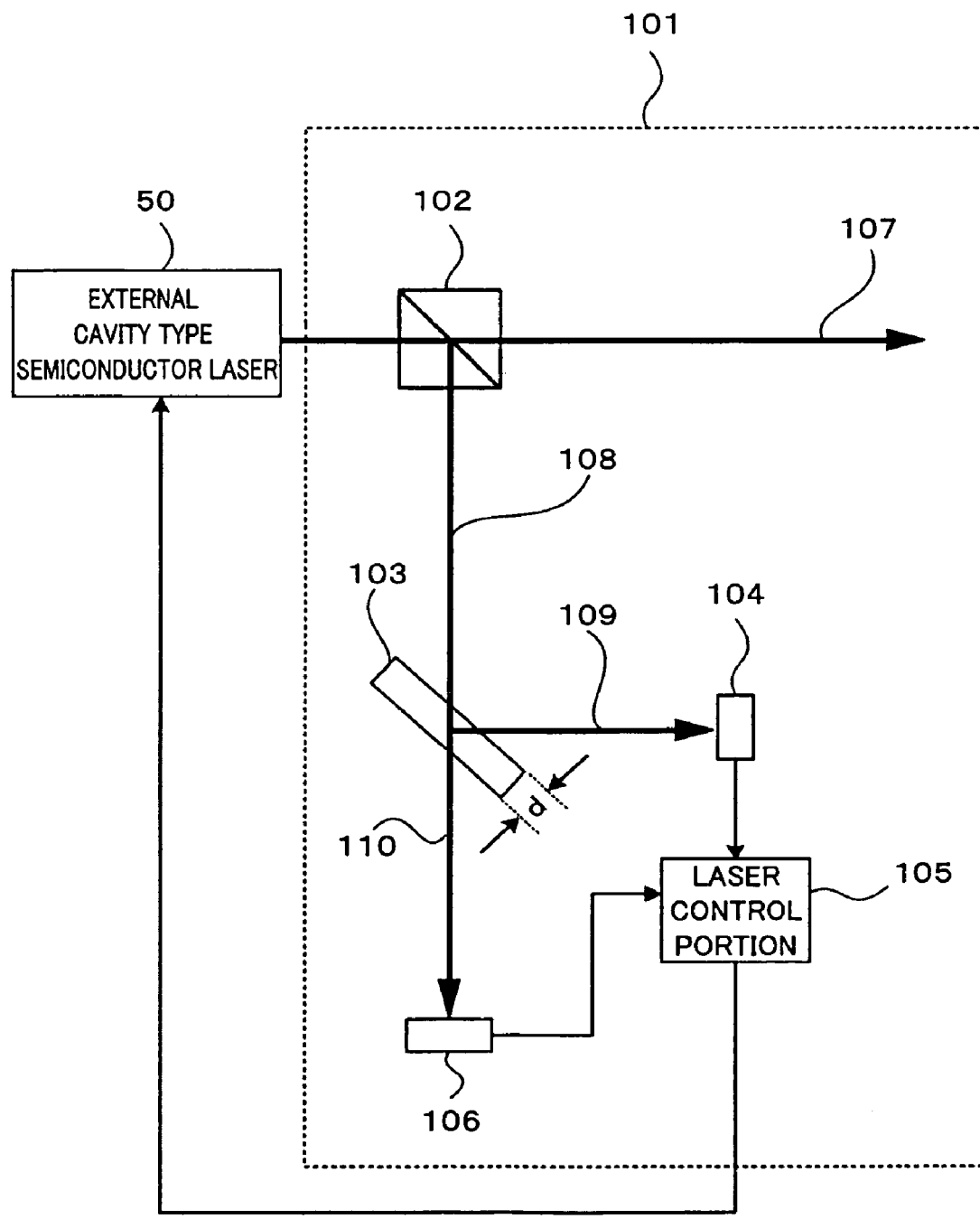
FIG. 23 is a schematic diagram showing a structure of a laser system according to another embodiment of the present invention.

Next, a laser system according to another embodiment of the present invention will be described. A laser system of this embodiment is denoted by 101. The laser system 101 is shown in FIG. 23. The laser system 101 has a beam splitter 102, an optical wedge 103, a two-divided detector 104, a laser control portion 105, and a detector 106.

The laser system 101 has the detector 106 in addition to the structure of the laser system 51 of the foregoing embodiment. The optical wedge 103 is tapered so that the thickness d of the optical wedge 103 decreases in the same direction as the optical wedge of the laser system 51 of the foregoing embodiment. In this example, a light beam 110 that transmits the optical wedge 103 can be used instead of the total amount of light. The result detected by the detector 106 may be used as a sum signal that is the denominator of the foregoing formula 9 and as a signal with which the semiconductor laser drive circuit 93 performs the APC.

According to embodiments of the present invention, a laser light beam reflected by the optical wedge is received by the two-divided detector and the amounts of light are detected by the detector. However, according to another embodiment of the present invention, other than the two-divided detector may be used. For example, with two independent detectors, the amounts of light at two positions may be detected. A laser light beam reflected by the optical wedge may be detected at three or more positions so as to determine the wavelength of the laser light beam.

According to embodiments of the present invention, a laser light beam is entered into an optical wedge that has an index of refraction of 1.5 and a wedge angle of 0.02 degrees with an incident angle of 45 degrees. Two detector having a width of 3 mm each are arranged in a row at a position apart from the tip portion of the optical wedge by 6001.6 mm so that they are in contact at the position. The relationship between the push-pull value and the wavelength is pre-obtained. However, it should be noted that embodiments of the present invention are not limited to these structural conditions. Alternatively, a laser light beam may be entered into another type optical wedge with another incident angle. In addition, detectors may be arranged at any positions apart from the optical wedge. As long as the wavelength of a laser light beam that enters the optical wedge is identified using the difference value of detected results of the amounts of light detected by a plurality of detectors, any structure may be used.

However, it is preferred that the two detectors be arranged in a row at an interval of ¼ or less of the period of the distribution of light intensities of each of the curve 21 to the curve 25 shown in FIG. 11. For example, with respect to the curve 21, the center portions of the first detector and the second detector are arranged at the position of 6001.45 nm for a crest portion of the curve 21 (having a light intensity of 1.0) and the position of 6001.75 nm for a portion adjacent to the crest portion (having a light intensity of 0.0), respectively.

In addition, as described above, two detectors may be arranged in various manners. For example, they may be arranged like the first detector 35 and the second detector 36 as shown in FIG. 11. When the first detector 35 and the second detector 36 are arranged as shown in FIG. 11, the push-pull value for the curve 21 and the curve 22 that almost coexist becomes almost 0. The push-pull value for the curve 23 or the curve 25 that almost independently exists becomes almost 0.5. In this case, when the push-pull value becomes close to 0, the laser power supplied to the semiconductor laser needs to be varied. In other words, in this arrangement, the push-pull value of a light beam having a wavelength in the mode hop region of the external cavity becomes largely different from the push-pull value of a light beam having a wavelength in the mode hop region of the laser chip of the external cavity type semiconductor laser.

Detectors used in embodiments of the present invention are light detectors such as photo diodes. Alternatively, interference fringes may be detected by a one-dimensional or two-dimensional detector array such as a charge coupled device (CCD). Since interference fringes take place in the z axis direction, when a one-dimensional detector array is used, it is arranged in the z axis direction. The amounts of light of light beams can be detected with a one-dimensional CCD array.

In the foregoing, a Littrow external cavity semiconductor laser was described. Alternatively, another external cavity type semiconductor laser for example Littman type may be used.

Embodiments of the present invention have a wavelength determination function that determines the wavelength of a laser light beam on the basis of a push-pull value and a laser power control function that prevents a laser light beam that has a unusable mode from being emitted when the wavelength of the laser light beam varies and the laser light beam is going to have an unusable mode. Thus, according to embodiments of the present invention, with only the wavelength determination function, a measured wavelength can be displayed. When only the laser power control function is used to prevent a laser light beam having a unusable mode from being emitted is used, it is sufficient to obtain only a push-pull value. In this case, the wavelength determination function for a laser light beam can be omitted.

According to embodiments of the present invention, a laser light beam is reflected by an optical wedge. The light intensities of the interference fringes are detected. Thus, according to embodiments of the present invention, it was supposed that an optical wedge is used. However, since there are optical devices that have the same effects as an optical wedge, the scope of the present invention is not limited to substances that always contain an optical wedge. According to embodiments of the present invention, all types of reflection devices that receive a laser light beam and emits interference fringes, namely all reflection devices that receive a laser light beam and emit reflected light beams that have different distributions of light intensities in predetermined directions may be used.

For example, when a glass plate whose front and rear surfaces are flat is used instead of an optical wedge, if a laser light beam is a slightly diffused light beam or a slightly converged light beam, as the wavelength varies, interference fringes varies like the optical wedge. Depending on the angle between the incident laser light beam and a flat surface of a glass plate, the fringes may become straight or curved.

Since the wave surface of a laser light beam that is a dispersed light beam or a converged light beam is not flat, when the laser light beam enters a flat glass plate with a predetermined angle (for example, an obscure glass plate that transmits a reflected light), concentric interference fringes take place. At this point, when the wavelength of the laser light beam varies, the concentric interference fringes spread or contract. Thus, when the angle of the flat glass is varied, interference fringes that are apart from the center of the concentric circles appear (on the obscure glass plate) In this case, fringes curve. On the other hand, when the angle of the flat glass plate is further adjusted, interference fringes are further apart from the center of the concentric circles. In this case, the interference fringes become almost linear fringes.

It should be understood by those skilled in the art that various modifications, combinations, sub- combinations and alternations may occur depending on design requirements and other factors insofar as they are within the scope of the appended claims or the equivalents thereof.

What is claimed is:

1. A wavelength determining apparatus, comprising:
   reflection means for receiving at least part of a laser light beam emitted from an external cavity type semiconductor laser and emitting a reflected light beam that has a distribution of light intensities of fringes;
   light detection means for detecting an intensity of the light beam reflected from said reflection means in two or more different light reception positions; and
   determination means for obtaining a difference value of detection signals in the two or more light reception positions and determining the wavelength of the laser light beam on the basis of the difference value,
   wherein the two or more light reception positions are arranged in the direction of which the fringes take place,
   wherein the two or more light reception positions are set so that difference values are obtained for light beams having a first wavelength group that take place in a mode hop region of an external cavity, and
   wherein said determination means determines the wavelength of the laser light beam by identifying wavelengths corresponding to the difference values.

2. The wavelength determining apparatus as set forth in claim 1, wherein the two or more light reception positions are set so that difference values are obtained for light beams having the first wavelength group that take place in the mode hop region of the external cavity and light beams having a second wavelength group that take place in a mode hop region of a semiconductor laser chip of the external cavity type semiconductor laser, and
   wherein said determination means determines the wavelength of the laser light beam by identifying wavelengths corresponding to the difference values.

3. The wavelength determining apparatus as set forth in claim 1, wherein the distribution of the intensity of the reflected light beam periodically varies, and
   wherein the distance of the two or more light reception positions is ¼ or less of the period of the variation of the intensity of the reflected light beam.

4. The wavelength determining apparatus as set forth in claim 1, wherein said light detection means has one or a plurality of light detectors, and
   wherein the intensities of the reflected light beams in at least two light reception positions are detected by the one or plurality of light detectors.

5. The wavelength determining apparatus as set forth in claim 1, wherein said reflection means is an optical wedge with a central axis disposed at an angle offset from perpendicular to the incident laser light, and wherein the thickness of the wedge decreases in a direction perpendicular to the central axis.

6. A wavelength determining method, comprising the steps of:
   receiving at least part of a laser light beam emitted from an external cavity type semiconductor laser and emitting a reflected light beam that has a distribution of light intensities of fringes;
   detecting the light intensity of the light beam reflected at the reflection step in two or more different light reception positions; and
   obtaining a difference value of detection signals in the two or more light reception positions and determining the wavelength of the laser light beam on the basis of the difference value,
   wherein the two or more light reception positions are arranged in the direction of which the fringes take place,
   wherein the two or more light reception positions are set so that difference values are obtained for light beams having a first wavelength group that take place in a mode hop region of an external cavity, and
   wherein the determination step determines the wavelength of the laser light beam by identifying wavelengths corresponding to the difference values.

7. The wavelength determining method as set forth in claim 6,
   wherein the two or more light reception positions are set so that difference values are obtained for light beams having the first wavelength group that take place in the mode hop region of the external cavity and light beams having a second wavelength group that take place in a mode hop region of a semiconductor laser chip of the external cavity type semiconductor laser, and
   wherein said determination step determines the wavelength of the laser light beam by identifying wavelengths corresponding to the difference values.

8. The wavelength determination method as set forth in claim 6, wherein the difference values of the detection signals are normalized by the sum of detection signals obtained in the two or more light reception positions.

9. A semiconductor laser controlling apparatus, comprising:
   reflection means for receiving at least part of a laser light beam emitted from an external cavity type semiconductor laser arid emitting a reflected light beam that has a distribution of light intensities of fringes;
   light detection means for detecting an intensity of the light beam reflected from said reflection means in two or more different light reception positions; and
   control means for obtaining a difference value of detection signals in the two or more light reception positions and increasing or decreasing a current value supplied to the external cavity type semiconductor laser when the difference value becomes a predetermined value,
   wherein the two or more light reception positions are arranged in the direction of which the fringes take place,
   wherein the two or more light reception positions are set so that difference values are obtained for light beams having a first wavelength group that take place in a mode hop region of an external cavity, and
   wherein when a difference value corresponding to a wavelength approaching a second wavelength group that takes place in a mode hop region of a laser chip of the external cavity type semiconductor laser is obtained, said control means controls the semiconductor laser so that the wavelength of the laser light beam emitted from the semiconductor laser avoids the second wavelength group.

10. The semiconductor laser controlling apparatus as set forth in claim 9,
wherein the two or more light reception positions are set so that difference values are obtained for light beams having the first wavelength group and light beams having the second wavelength group, and
wherein when a difference value corresponding to a wavelength approaching the second wavelength group is obtained, said control means controls the semiconductor laser so that the wavelength of the laser light beam emitted from the semiconductor laser avoids the second wavelength group.

11. The semiconductor laser controlling apparatus as set forth in claim 9,
wherein the difference values of the detection signals are normalized by the sum of detection signals obtained in the two or more light reception positions.

12. A semiconductor laser controlling method, comprising the steps of:
receiving at least part of a laser light beam emitted from an external cavity type semiconductor laser and emitting a reflected light beam that has a distribution of light intensities of fringes;
detecting the intensity of the light beam reflected at the reflection step in two or more different light reception positions; and
obtaining a difference value of detection signals in the two or more light reception positions and increasing or decreasing a current value supplied to the external cavity type semiconductor laser when the difference value becomes a predetermined value, and
wherein the two or more light reception positions are arranged in the direction of which the fringes take place,
wherein the two or more light reception positions are set so that difference values are obtained for light beams having a first wavelength group that take place in a mode hop region of an external cavity, and
wherein when a difference value corresponding to a wavelength approaching a second wavelength group that takes place in a mode hop region of a laser chip of the external cavity type semiconductor laser is obtained, the control step is performed by controlling the semiconductor laser so that the wavelength of the laser light beam emitted from the semiconductor laser avoids the second wavelength group.

13. The semiconductor laser controlling method as set forth in claim 12,
wherein the two or more light reception positions are set so that difference values are obtained for light beams having the first wavelength group and light beams having the second wavelength group, and
wherein when a difference value corresponding to a wavelength approaching the second wavelength group is obtained, the control step is performed by controlling the semiconductor laser so that the wavelength of the laser light beam emitted from the semiconductor laser avoids the second wavelength group.

14. The semiconductor laser controlling method as set forth in claim 12,
wherein the difference values of the detection signals are normalized by the sum of detection signals obtained in the two or more light reception positions.

* * * * *